US011683000B1

(12) United States Patent
Lin et al.

(10) Patent No.: US 11,683,000 B1
(45) Date of Patent: Jun. 20, 2023

(54) SYSTEM AND METHOD FOR DETECTING A FAULT OF AN OPERATION OF A SYNCHRONOUS MOTOR

(71) Applicant: Mitsubishi Electric Research Laboratories, Inc., Cambridge, MA (US)

(72) Inventors: Chungwei Lin, Cambridge, MA (US); Bingnan Wang, Cambridge, MA (US); Saleh Nabi, Cambridge, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 0 days.

(21) Appl. No.: 17/651,321

(22) Filed: Feb. 16, 2022

(51) Int. Cl.
*H02P 21/18* (2016.01)
*H02P 29/024* (2016.01)
*G01R 31/34* (2020.01)

(52) U.S. Cl.
CPC ......... *H02P 29/024* (2013.01); *G01R 31/343* (2013.01); *H02P 21/18* (2016.02); *H02P 2207/05* (2013.01)

(58) Field of Classification Search
CPC .... H02P 29/024; H02P 21/18; H02P 2207/05; G01R 31/343
See application file for complete search history.

(56) References Cited

U.S. PATENT DOCUMENTS

| 4,845,424 A * | 7/1989 | Gamble | H02K 26/00 324/144 |
|---|---|---|---|
| 8,610,452 B2 * | 12/2013 | Lee | G01R 31/343 324/205 |
| 8,997,698 B1 * | 4/2015 | Roth | F01P 3/08 123/41.35 |
| 9,018,881 B2 * | 4/2015 | Mao | H02P 29/0241 318/696 |

(Continued)

OTHER PUBLICATIONS

Hannon et al. "Two Dimensional Fourier Based Modeling of Electric Machines, An Overview." IEEE Transactions on Magnetics, vol. 55, No. 10, Oct. 2019. 8107217.

(Continued)

*Primary Examiner* — Rina I Duda
(74) *Attorney, Agent, or Firm* — Gennadiy Vinokur; Hironori Tsukamoto

(57) ABSTRACT

The present disclosure provides a system and a method for detecting a fault of an operation of a synchronous motor. The method includes collecting an electrical input and measurements associated with the operation of the synchronous motor caused by the electrical input. The method further includes determining sequences of points defining a mutual position between a stator and a rotor of the synchronous motor that results in magnetostatic determined as a weighted summation over real-space basis functions parameterized on pairs of adjoint points in the determined sequence of points and weighted with a surface charge density between corresponding adjoint points, such that the resulted magnetostatic (Continued)

explains the measurements of the operation of the synchronous motor given the electrical input. Further, the method includes determining the fault of the operation of the synchronous motor based on the mutual position between the stator and the rotor of the synchronous motor.

20 Claims, 21 Drawing Sheets

(56) References Cited

U.S. PATENT DOCUMENTS

2016/0282416 A1* 9/2016 Choi .................... G01R 31/343
2020/0186069 A1* 6/2020 Moule ................ H02P 21/0025

OTHER PUBLICATIONS

Sasaki et al. "Topology Optimization using Basis Functions for Improvement of Rotating Machine Performances," IEEE Tramsactions on Magnetics Article accepted for inclusion in future issue. No date available. p. 1-4.

* cited by examiner

| Parameters — 701 | Type of fault — 703 | Severity of fault — 705 | Control command — 707 |
|---|---|---|---|
| Parameters1 — 709 | Bearing fault — 711 | High — 713 | Stop — 715 |
| Parameters2 — 717 | Static eccentricity fault — 719 | Medium — 721 | Reduce speed — 723 |
| . | . | . | . |
| . | . | . | . |
| . | . | . | . |
| ParametersN | | | |

FIG. 7

| $\mu_r$ [$r_1 = 0.3, r_2 = 1$ are fixed] | 2 | 10 | 50 | 100 |
|---|---|---|---|---|
| analytical $H_X(0)$ | 0.8979 | 0.3517 | 0.0838 | 0.0429 |
| H/B-solver $H_X(0)$ (80×2 points) | 0.9019 | 0.3774 | 0.1195 | 0.0803 |
| H/B-solver $H_X(0)$ (400×2 points) | 0.8987 | 0.3570 | 0.0908 | 0.0505 |
| H/B-solver $H_X(0)$ (1000×2 points) | 0.8981 | 0.3536 | 0.0864 | 0.0460 |
| BH-solver $H_X(0)$ (80×2 points) | 0.9034 | 0.3663 | 0.0894 | 0.0463 |
| BH-solver $H_X(0)$ (80×2 points) | 0.9013 | 0.3606 | 0.0871 | 0.0448 |
| BH-solver $H_X(0)$ (400×2 points) | 0.8985 | 0.3535 | 0.0845 | 0.0432 |
| FEA (Mathematica, 3512 points) | 0.9015 | 0.3653 | 0.0906 | 0.047 |

FIG. 12B

SYSTEM AND METHOD FOR DETECTING A FAULT OF AN OPERATION OF A SYNCHRONOUS MOTOR

TECHNICAL FIELD

The present disclosure relates generally to synchronous motors, such as reluctance and permanent magnet motors, and more specifically to a system and a method detecting a fault of an operation of a synchronous motor.

BACKGROUND

Synchronous motors are broadly used in various industrial applications that include pumps, chemical, petrochemical, electrified transportation systems, etc. In many applications, the synchronous motors are operated under some unfavorable conditions, such as high ambient temperature, high moisture, and overload, which can eventually result in malfunctions that lead to high maintenance costs and severe financial loss due to unexpected downtime.

The malfunction of the synchronous motors is generally attributed to faults of different categories, which include drive inverter failures, stator winding insulation breakdowns, broken rotor bar faults, and other mechanical faults. Several surveys of faults of synchronous machines conducted by IEEE Industry Application Society (IEEE-IAS) and Japan Electrical Manufacturers' Association (JEMA) reveal that mechanical faults are the most common fault type. Examples of the mechanical faults include bearing faults and/or eccentricity faults of the synchronous motor.

The bearing fault can be detected with vibration and acoustic analysis. However, accuracy of bearing fault diagnostics based on vibration or acoustic signals can be influenced by background noise due to external mechanical excitation motion, while its sensitivity is also subject to change based on sensor mounting positions. An alternative approach for bearing fault detection is accomplished by analyzing a stator current of the synchronous motor. However, a magnitude of the stator current at bearing fault signature frequencies can vary at different loads, different speeds, and different power ratings of the synchronous motors themselves, thus bringing challenges to identify a threshold stator current value to trigger a fault alarm at an arbitrary operating condition.

Similarly, the eccentricity faults in the synchronous motors have been studied extensively over the last few decades. The eccentricity faults can exist in form of a static or a dynamic eccentricity or both, in which case it is called a mixed eccentricity fault. The eccentricity faults cause bearing damage, excessive vibration, and noise, unbalanced synchronous pull, and under extreme conditions, stator-rotor rub which may damage the synchronous motors. The eccentricity faults can cause or be caused by the bearing fault. Hence, in theory, similar fault detection methods can be applied for detecting the eccentricity faults of the synchronous motors. In practice, however, due to difficulties of detecting different types of faults of the synchronous motor, different techniques are tuned to detect the different types of faults.

Accordingly, there is a need to provide a method for detecting the different types of faults in the synchronous motor.

SUMMARY

It is an object of some embodiments to provide a system and a method for determining of different types of faults in an operation of a synchronous motor. Examples of the synchronous motor include reluctance and permanent magnet motors. Examples of the faults include mechanical faults that include different types of bearing faults and different types of eccentricity faults. Additionally or alternatively, it is an object of some embodiments to provide such a method that can determine the different types of faults from the same input. Additionally or alternatively, it is an object of some embodiments to provide such a method that can determine the different types of eccentricity faults in the synchronous motor, such as a static eccentricity, a dynamic eccentricity, or both.

The synchronous motor includes a stator and a rotor separated by an air gap. Some embodiments are based on recognition that the synchronous motor includes interfaces between different materials of the synchronous motor. For example, the synchronous motor includes two interfaces. A first interface is between the stator of the synchronous motor and air in an air gap, and a second interface is between the air in the air gap and the rotor of the synchronous motor. The first interface between the stator and the air in the air gap is represented by one sequence of points, for example, $z_0, z_1, z_2, z_3, \ldots, z_N$, and the second interface between the air in the air gap and the rotor is represented by another sequence of points, for example, $y_0, y_1, y_2, y_3, \ldots, y_N$. Thus, these sequences of points form the interfaces between the different materials of the synchronous motor. Further, the sequences of points define a mutual position between the stator and the rotor.

Some embodiments are based on the realization that the faults are caused by a fault in structure of the synchronous motor that results in a misalignment between rotor and stator positions. In other words, the fault results a change in the mutual position between the stator and the rotor. Different types of faults results in different mutual positions between the stator and the rotor. Hence, if the mutual position between the stator and the rotor can be determined online from measurements of operation of the synchronous motor, the mutual position between the stator and the rotor can be used to detect different types of faults. However, the determination of the mutual position between the stator and the rotor is memory and computationally expensive. Hence, it is an object of some embodiments to provide a practical approach suitable for online estimation of a structure of the synchronous motor to determine the mutual position between the stator and the rotor.

Some embodiments are based on the realization that the structure of the synchronous motor can be represented by material distribution of its components during the operation of the synchronous motor. For example, a distribution of magnetic fields can be determined using principles of magnetostatics, which in turn can be used to describe the operation of the synchronous motor. As a result, the principles of magnetostatics can connect the structure of the synchronous motor with its operation, and hence, can be used to analyzed the structure of the synchronous motor during its operation.

Magnetostatics is a study of magnetic fields in systems where currents are steady (not changing with time). Magnetostatics is magnetic analog of electrostatics, where charges are stationary. However, in many cases magnetization need not be static and equations of magnetostatics can be used to predict fast synchronized switching events that occur on time scales of nanoseconds or less. Magnetostatics is even a good approximation when the currents are not static, as long as the currents do not alternate rapidly. While the magnetostatics is typically used in applications of micromagnetic such as models of magnetic storage devices as in computer memory, magnetostatic focusing can be achieved either by a permanent magnet or by passing a current through a coil of wire whose axis coincides with a beam axis. Hence, the magnetostatics can be used to analyze the structure of the synchronous motor.

Some embodiments are based on the realization that the mutual position between the stator and the rotor can be learned online to explain an electrical output corresponding to an electrical input, based on the principles of magnetostatics. Specifically, some embodiments are based on understanding that there is a relationship between mutual positions between the stator and the rotor of the synchronous motor and magnetostatics. Besides, some embodiments are based on the recognition that there is a relationship between the electrical input, magnetostatics generated by the synchronous motor in response to the electrical input, and the electrical output or the measurements of the operation of the synchronous motor. Hence, different magnetostatics are determined for different mutual positions between the stator and the rotor. Further, a magnetostatic that explains the electrical output given the electric input, is selected. The mutual position corresponding to the selected magnetostatic is a current/actual mutual position.

In such a manner, by evaluating the different mutual positions between the stator and the rotor, a mutual position between the stator and the rotor that best matches the electrical output given the electric input can be determined using the magnetostatics. Further, based on the determined mutual position between the stator and the rotor, the fault can be determined. However, to do so, there is a need for an efficient and compact representation of the magnetostatic.

For example, the magnetostatic can be estimated with finite element analysis (FEA) and/or a finite difference analysis that can be regarded as a variant of FEA. However, FEA typically solves for a potential that requires boundary values at locations larger than a region of interest. As a result, the magnetostatic determined using FEA is represented as a set of points of a space surrounding and including the synchronous motor. Such a representation is inconvenient and memory-consuming. For example, the FEA method needs at least 5000 points to represent a simple motor of cylindrical shape.

Another approach for determining the magnetostatic is using an Eigen function expansion (EE) method. The EE method expresses solution in terms of Eigen functions and automatically satisfies partial differential equations. However, the EE method only works for motors whose component geometry is consistent with polar coordinates. Hence, for using the EE method, shape of any component of the motor needs to be approximated as a sector and/or a combination of sectors, which is not always practical.

Accordingly, there is a need for an alternative solver of two-dimensional magnetic field and efficient and compact representation of magnetostatic found with this solver suitable for online fault detection during the operation of the synchronous motor.

Some embodiments are based on the realization that the magnetostatic can be represented as a weighted summation over real-space basis functions. Each real-space basis function is analytical and is parametrized by the sequence of points forming the interfaces of different materials inside the synchronous motor and weighted with surface charge density. Specifically, the real—space basis functions are parameterized by pairs of adjoint points, for example, points $z_1$ and $z_2$ of the sequence of points and weighted with a surface charge density between corresponding adjoint points, for example, a surface charge density between the points $z_1$ and $z_2$. According to an embodiment, the surface charge density is determined by iteratively matching boundary conditions on the interfaces imposed by Maxwell equations. Representation of the magnetostatic as the weighted summation over real-space basis functions provides a compact representation of the magnetostatic. In addition, such a representation is independent of a load of the motor.

To that end, different magnetostatics for different mutual positions at different instances of time are determined by calculating, for each mutual position, a weighted summation over real-space basis functions parameterized on the sequences of points representing the interfaces between the different materials and weighted the surface charge density. Further, a magnetostatic that explains the electrical output given the electric input, is selected. Further, the sequences of points defining the mutual position between the stator and the rotor are determined from the selected magnetostatic. Furthermore, the fault of the operation of the synchronous motor is determined based on the mutual position between the stator and the rotor.

In such a manner, some embodiments use novel representation of the magnetostatic of the synchronous motor as the weighted summation over real-space basis functions. Further, such a representation of the magnetostatic is compact and memory-efficient representation of the magnetostatic and is suitable for online control or monitoring of the synchronous motor. Due to this improvement, some embodiments design a fault detector suitable for online estimation of different types of faults of the synchronized motor.

Accordingly, one embodiment discloses a fault detector for detecting a fault of an operation of a synchronous motor including a stator and a rotor separated by an air gap. The fault detector comprises a processor; and a memory having instructions stored thereon that, when executed by the processor, cause the fault detector to: collect, over a communication channel including one or a combination of a wired and wireless communication link, an electrical input for controlling the operation of the synchronous motor and measurements of the operation of the synchronous motor caused by the electrical input; determine sequences of points defining a mutual position between the stator and the rotor of the synchronous motor forming interfaces of different materials inside the synchronous motor that results in magnetostatic determined as a weighted summation over real-space basis functions parameterized on pairs of adjoint points in the determined sequence of points and weighted with a surface charge density between corresponding adjoint points, such that the resulted magnetostatic explains the measurements of the operation of the synchronous motor given the electrical input; determine the fault of the operation of the synchronous motor based on the mutual position between the stator and the rotor of the synchronous motor; and transmit over the communication channel one or a combination of an indication of the fault of the operation of the synchronous motor and a control command selected based on the fault.

Accordingly, another embodiment discloses a method for detecting a fault of an operation of a synchronous motor including a stator and a rotor separated by an air gap. The method comprises collecting, over a communication channel including one or a combination of a wired and wireless communication link, an electrical input for controlling the operation of the synchronous motor and measurements of the operation of the synchronous motor caused by the electrical input; determining sequences of points defining a mutual position between the stator and the rotor of the synchronous motor forming interfaces of different materials inside the synchronous motor that results in magnetostatic determined as a weighted summation over real-space basis functions parameterized on pairs of adjoint points in the determined sequence of points and weighted with a surface charge density between corresponding adjoint points, such that the resulted magnetostatic explains the measurements of the operation of the synchronous motor given the electrical input; determining the fault of the operation of the synchronous motor based on the mutual position between the stator and the rotor of the synchronous motor; and transmitting over the communication channel one or a combination of an indication of the fault of the operation of the synchronous motor and a control command selected based on the fault.

Accordingly, yet another embodiment discloses a non-transitory computer-readable storage medium embodied thereon a program executable by a processor for performing a method for detecting a fault of an operation of a synchronous motor including a stator and a rotor separated by an air gap. The method comprises collecting, over a communication channel including one or a combination of a wired and wireless communication link, an electrical input for controlling the operation of the synchronous motor and measurements of the operation of the synchronous motor caused by the electrical input; determining sequences of points defining a mutual position between the stator and the rotor of the synchronous motor forming interfaces of different materials inside the synchronous motor that results in magnetostatic determined as a weighted summation over real-space basis functions parameterized on pairs of adjoint points in the determined sequence of points and weighted with a surface charge density between corresponding adjoint points, such that the resulted magnetostatic explains the measurements of the operation of the synchronous motor given the electrical input; determining the fault of the operation of the synchronous motor based on the mutual position between the stator and the rotor of the synchronous motor; and transmitting over the communication channel one or a combination of an indication of the fault of the operation of the synchronous motor and a control command selected based on the fault.

BRIEF DESCRIPTION OF THE DRAWINGS

The presently disclosed embodiments will be further explained with reference to the attached drawings. The drawings shown are not necessarily to scale, with emphasis instead generally being placed upon illustrating the principles of the presently disclosed embodiments.

FIG. 7 shows a tabular column of example data stored in a memory of the fault detector, according to an embodiment of the present disclosure.

FIG. 12B shows a tabular column depicting comparison of results from different solvers, according to an embodiment of the present disclosure.

DETAILED DESCRIPTION

In the following description, for purposes of explanation, numerous specific details are set forth in order to provide a thorough understanding of the present disclosure. It will be apparent, however, to one skilled in the art that the present disclosure may be practiced without these specific details. In other instances, apparatuses and methods are shown in block diagram form only in order to avoid obscuring the present disclosure.

As used in this specification and claims, the terms "for example," "for instance," and "such as," and the verbs "comprising," "having," "including," and their other verb forms, when used in conjunction with a listing of one or more components or other items, are each to be construed as open ended, meaning that that the listing is not to be considered as excluding other, additional components or items. The term "based on" means at least partially based on. Further, it is to be understood that the phraseology and terminology employed herein are for the purpose of the description and should not be regarded as limiting. Any heading utilized within this description is for convenience only and has no legal or limiting effect.

Figure 1A:
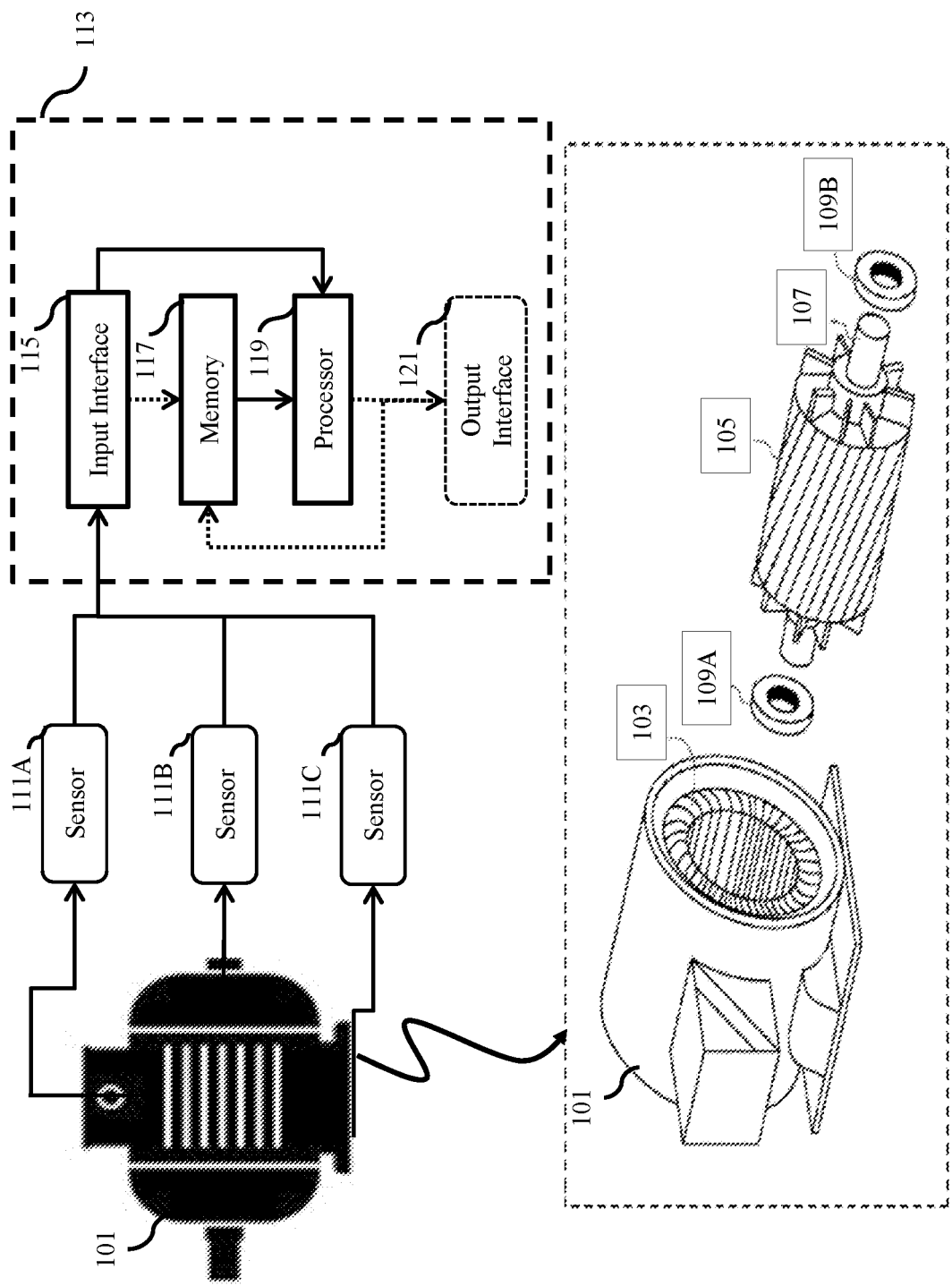
FIG. 1A shows a schematic diagram of a synchronous motor, according to an embodiment of the present disclosure.

FIG. 1A shows a schematic diagram of a synchronous motor 101, according to an embodiment of the present disclosure. The synchronous motor 101 is an AC electric motor in which, at steady state, rotation of its shaft is synchronized with frequency of supply current. Examples of synchronized motors include reluctance and permanent magnet motors. The synchronous motor 101 includes a stator 103, a rotor 105, a main shaft 107, and two bearings 109A and 109B. Sensors 111A, 111B, 111C are connected to the synchronous motor 101. According to certain embodiments, the sensors 111A, 111B, 111C may be current and voltage sensors for obtaining current and voltage of each winding of the synchronous motor 101. Other sensors are contemplated including torque sensors, environmental sensors (temperature, humidity, etc.), and other types of sensors used to assist the operation, maintenance or management of the synchronous motor 101.

A fault detector 113 is connected to the synchronous motor 101. The fault detector 113 is configured to detect a fault of an operation of the synchronous motor 101. Sensor data gathered from the sensors 111A, 111B, 111C is inputted into an input interface 115 of the fault detector 113. The sensor data can also be stored in a memory 117. The sensor data is then processed by a processor 119 and either outputted to an output interface 121 or can be stored in the memory 117 of the fault detector 113, depending on user goals/interests. The fault detector 113 is explained in detail below with reference to FIG. 1B.

Figure 1B:
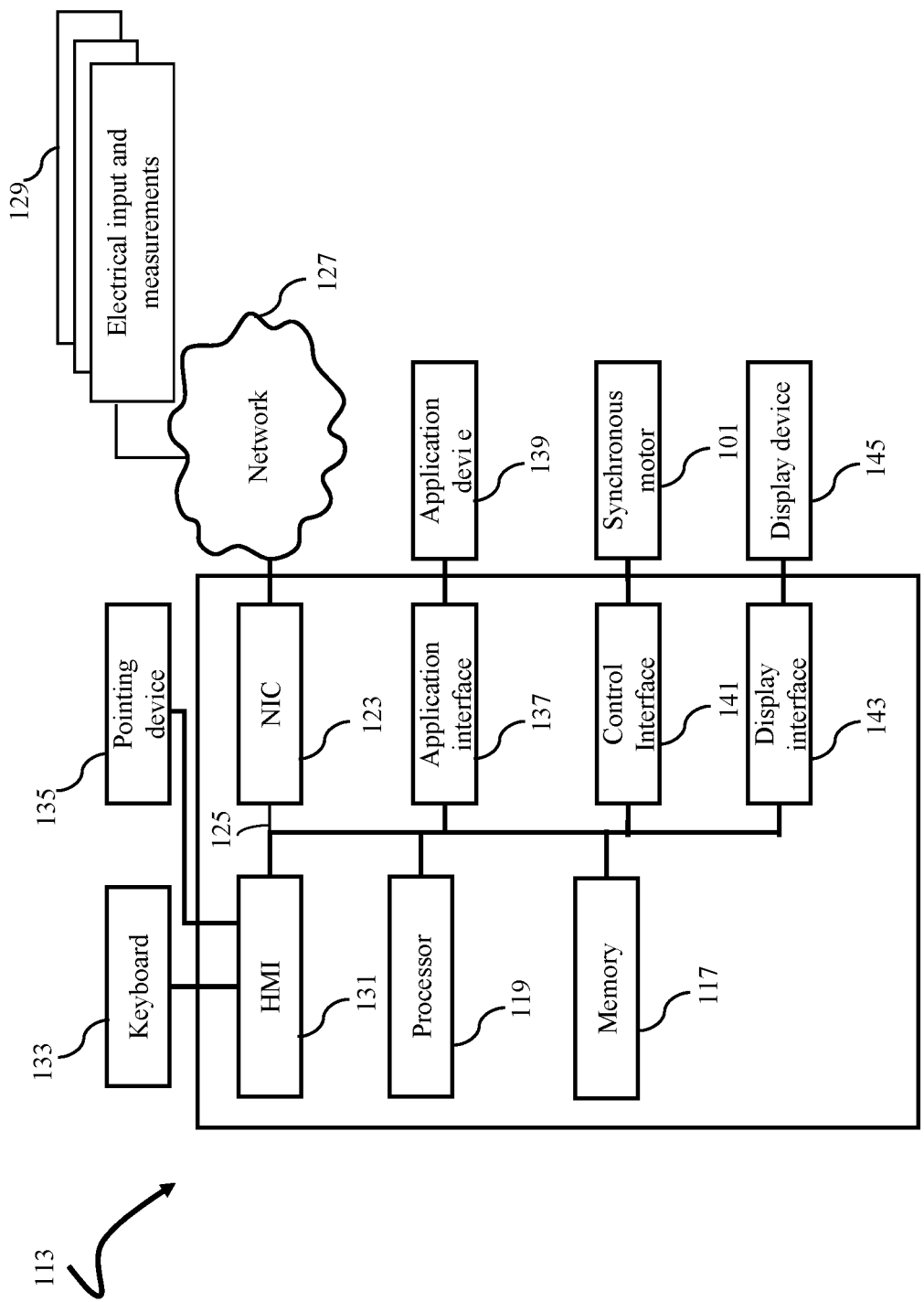
FIG. 1B shows a detailed block diagram of a fault detector for detecting a fault of an operation of the synchronous motor, according to an embodiment of the present disclosure.

FIG. 1B shows a detailed block diagram of the fault detector 113, according to an embodiment of the present disclosure. The fault detector 113 includes a network interface controller (NIC) 123 adapted to connect the fault detector 113 through a bus 125 to a network 127 (also referred to as communication channel). Through the network 127, either wirelessly or through wired links, the fault detector 113 collects an electrical input 129 for controlling an operation of the synchronous motor 101 and measurements of the operation of the synchronous motor 101 caused by the electrical input. The electrical input includes one or a combination of a current or a voltage of each winding, and the measurements include one or a combination of output torques and mutual inductance between different windings.

Further, in some implementations, a human machine interface (HMI) 131 within the fault detector 113 connects the fault detector 113 to a keyboard 133 and a pointing device 135. The pointing device 135 may include a mouse, trackball, touchpad, joystick, pointing stick, stylus, or touchscreen, among others. Further, the fault detector 113 includes an application interface 137 to connect the fault detector 113 to an application device 139 for performing various operations. The fault detector 113 may also include a control interface 141 to connect the fault detector 113 to the synchronous motor 101. For example, through the control interface 141, the fault detector 113 may control the synchronous motor 101. Additionally, the fault detector 113 may be linked through the bus 125 to a display interface 143 adapted to connect the fault detector 113 to a display device 145, such as a computer monitor, television, projector, or mobile device, among others.

The fault detector 113 further includes the processor 119 and the memory 117 that stores instructions that are executable by the processor 119. The processor 119 may be a single core processor, a multi-core processor, a computing cluster, or any number of other configurations. The memory 117 may include random access memory (RAM), read only memory (ROM), flash memory, or any other suitable memory system. The processor 119 is connected through the bus 125 to one or more input and output devices. The stored instructions implement a method for detecting the fault of the operation of the synchronous motor 101.

The processor 113 is configured to detect the fault of the operation of the synchronous motor 101. The faults, for example, include mechanical faults that include different types of bearing faults and different types of eccentricity faults of the synchronous motor 101. The different types of bearing faults include a cage defect, an outer race defect, an inner race defect, and a ball defect. The different types of eccentricity faults, for example, include a static eccentricity fault, a dynamic eccentricity fault, or both.

Figure 2A:
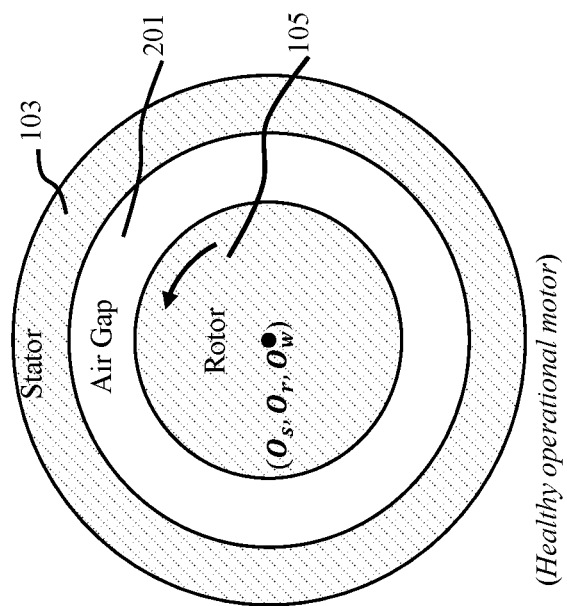
FIG. 2A shows a schematic illustrating a healthy synchronous motor, according to some embodiments of the present disclosure.

FIG. 2A to FIG. 2D are schematics illustrating the different types of eccentricity faults, according to some embodiments of the present disclosure. Any synchronous motor, such as the synchronous motor 101 comprises the stator 103 and the rotor 105 separated by an air gap 201 in between. The eccentricity fault is a type of motor fault caused by formation of unequal air gap between the stator 103 and the rotor 105. FIG. 2A shows the synchronous motor 101 that is healthy. A point Ow is a center of rotation, a point Os is a center of the stator 103, and a point Or is a center of the rotor 105. When the three points Ow, Os, and Or coincide, the synchronous motor 101 is healthy, meaning there is no eccentricity fault.

Figure 2B:
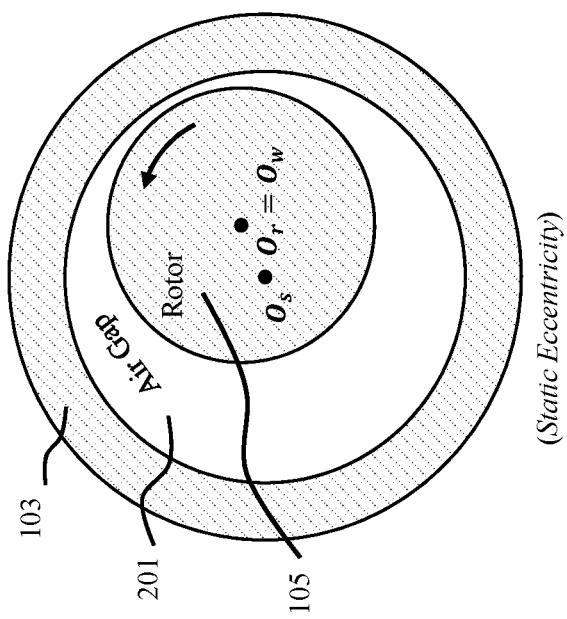
FIG. 2B shows a schematic illustrating a static eccentricity fault, according to some embodiments of the present disclosure.

FIG. 2B shows a schematic illustrating the static eccentricity fault, according to some embodiments of the present disclosure. The points Or and Ow coincide but are having an offset from the center of the stator Os. Since the rotor 105 always rotates around the center point Ow, a static eccentricity fault is present, and the air gap 201 between the stator 103 and the rotor 105 is not uniform at different locations.

Figure 2C:
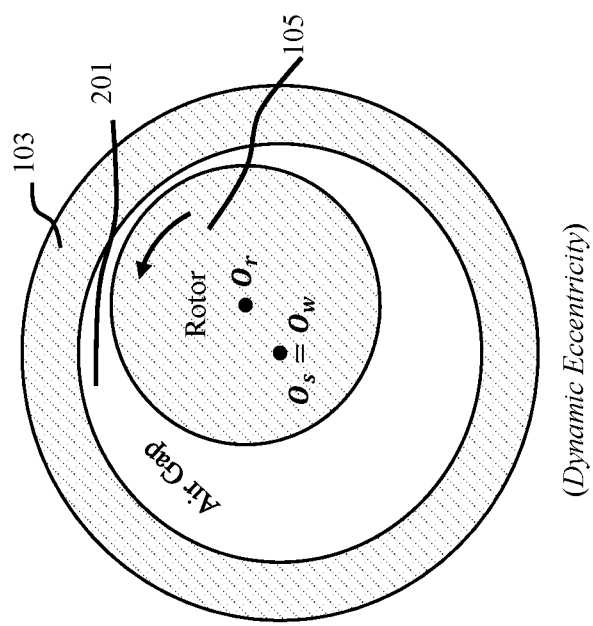
FIG. 2C shows a schematic illustrating a dynamic eccentricity fault, according to some embodiments of the present disclosure.

FIG. 2C shows a schematic illustrating the dynamic eccentricity fault, according to some embodiments of the present disclosure. The rotor's 105 center of rotation Ow is aligned with the stator center Os, but the rotor center Or is orbiting around the point Ow. Since the rotor 105 is not rotating around its own center of mass, the air gap length 201 will vary depending on rotation angle of the rotor 105 and change dynamically.

Figure 2D:
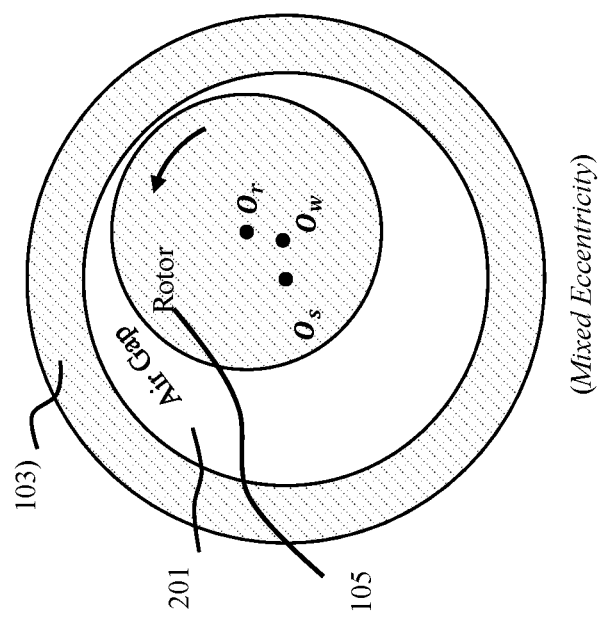
FIG. 2D shows a schematic illustrating mixture of both the static and dynamic eccentricity faults, according to some embodiments of the present disclosure.

FIG. 2D is a schematic illustrating mixture of both the static and dynamic eccentricity faults which is called a mixed eccentricity, according to some embodiments of the present disclosure. The points Or, Os, and $O_w$ are not aligned with each other. In this case, both the static eccentricity fault and dynamic eccentricity fault exist. From the faults illustrated in FIGS. 2B to 2D, it can be observed that the air gap 201 is not uniform, i.e., there is an air gap deviation.

Figure 3:
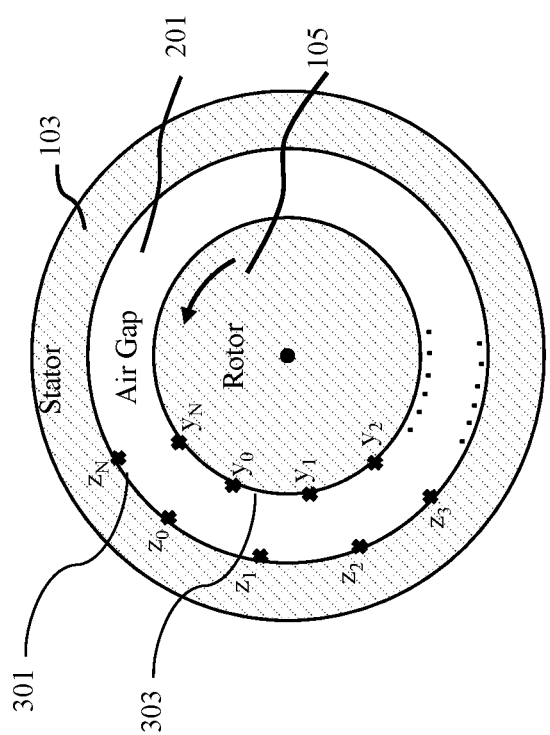
FIG. 3 shows a schematic illustrating interfaces of different materials inside the synchronous motor, according to some embodiments of the present disclosure.

According to an embodiment, the synchronous motor 101 includes interfaces between different materials of the synchronous motor 101. FIG. 3 shows a schematic illustrating the interfaces of the different materials inside the synchronous motor 101, according to some embodiments of the present disclosure. Here, there are two interfaces between the different materials of the synchronous motor 101. A first interface 301 is between the stator 103 and air in the air gap 201, and a second interface 303 is between the air in the air gap 201 and the rotor 105. The first interface 301 between the stator 103 and air in the air gap 201 is represented by one sequence of points, for example, $z_0, z_1, z_2, z_3, \ldots, z_N$, and the second interface 303 between the air in the air gap 201 and the rotor 105 is represented by another sequence of points, for example, $y_0, y_1, y_2, y_3, \ldots, y_N$. Thus, these sequences of points form the interfaces between the different materials of the synchronous motor 101. Further, the sequences of points define a mutual position between the stator 103 and the rotor 105.

Some embodiments are based on the realization that the faults are caused by a fault in structure of the synchronous motor 101 that results in a misalignment between rotor and stator positions. In other words, the fault results in a change in the mutual position between the stator 103 and the rotor 105. Different types of faults results in different mutual positions between the stator 103 and the rotor 105. Hence, if the mutual position between the stator 103 and the rotor 105 can be determined online from the measurements collected, the mutual position between the stator 103 and the rotor 105 can be used to detect different types of faults. However, the determination of the mutual position between the stator 103 and the rotor 105 is memory and computationally expensive. Hence, it is an object of some embodiments to provide a practical approach suitable for online estimation of a structure of the synchronous motor 101 to determine the mutual position between the stator 103 and the rotor 105.

Some embodiments are based on the realization that the structure of the synchronous motor 101 can be represented by material distribution of its components during the operation of the synchronous motor 101. For example, a distribution of magnetic fields can be defined using principles of magnetostatics, which in turn can be used to describe the operation of the synchronous motor 101. As a result, the principles of magnetostatics can connect the structure of the synchronous motor 101 with its operation, and hence, can be used to analyse the structure of the synchronous motor 101 during its operation.

Magnetostatics is a study of magnetic fields in systems where currents are steady (not changing with time). Magnetostatics is magnetic analog of electrostatics, where charges are stationary. Magnetization need not be static; equations of magnetostatics can be used to predict fast synchronized switching events that occur on time scales of nanoseconds or less. Magnetostatics is even a good approximation when the currents are not static, as long as the currents do not alternate rapidly. While the magnetostatics is typically used in applications of micromagnetics such as models of magnetic storage devices as in computer memory, magnetostatic focusing can be achieved either by a permanent magnet or by passing a current through a coil of wire whose axis coincides with a beam axis. Hence, the magnetostatics can be used to analyze the structure of the synchronous motor 101.

Figure 4:
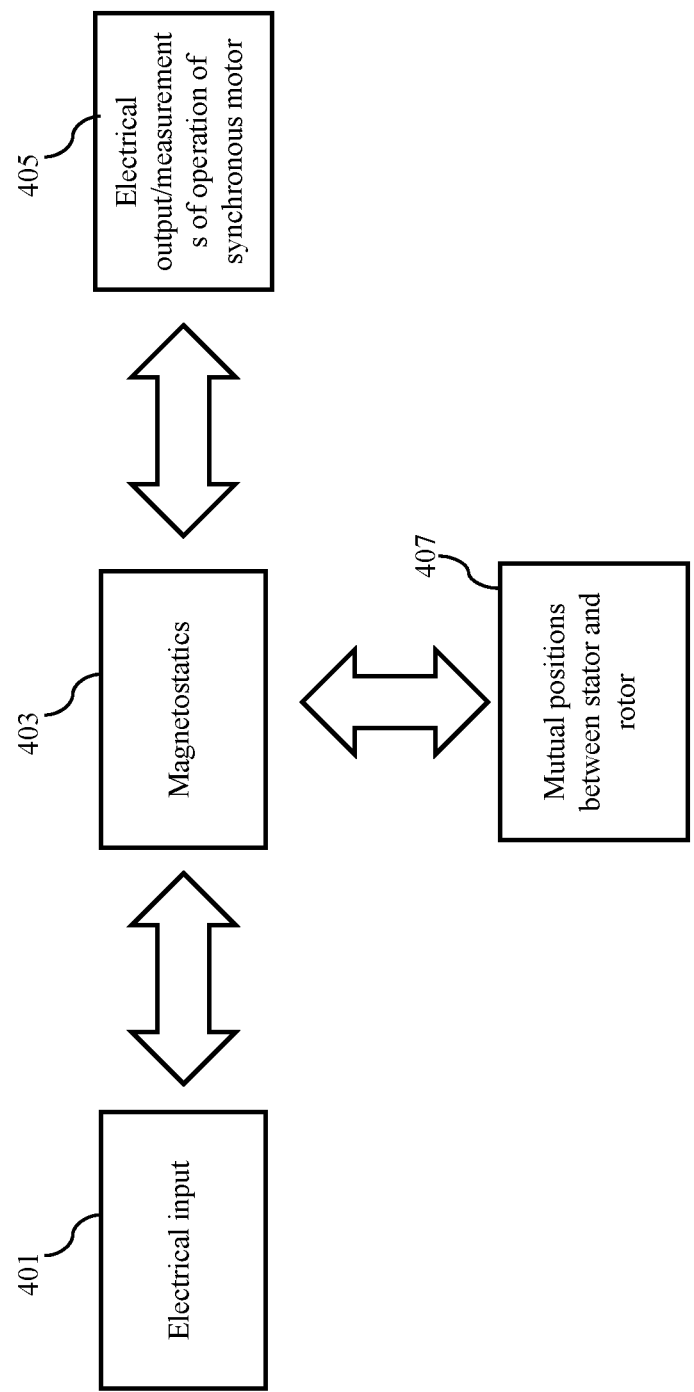
FIG. 4 shows a schematic for using magnetostatics to analyze a structure of the synchronous motor, according to some embodiments of the present disclosure.

FIG. 4 shows a schematic for using the magnetostatics to analyze the structure of the synchronous motor 101, according to some embodiments of the present disclosure. Some embodiments are based on the realization that the mutual position between the stator 103 and the rotor 105 can be learned online to explain an electrical output corresponding to the electrical input, based on the principles of magnetostatics. Specifically, some embodiments are based on understanding that there is a relationship between mutual positions 407 between the stator 103 and the rotor 105 of the synchronous motor 101 and magnetostatics 403. Besides, some embodiments are based on the recognition that there is a relationship between an electrical input 401, magnetostatics 403 generated by the synchronous motor 101 in response to the electrical input, and an electrical output or the measurements 405 of the operation of the synchronous motor 101. Hence, different magnetostatics are determined for different mutual positions between the stator 103 and the rotor 105. Further, a magnetostatic that explains the electrical output 405 given the electric input 401, is selected. The mutual position corresponding to the selected magnetostatic is a current/actual mutual position.

In such a manner, by evaluating the different mutual positions 407 between the stator 103 and the rotor 105, a mutual position between the stator 103 and the rotor 105 that explains the electrical output 405 given the electric input 401 can be determined using the magnetostatics 403. Further, based on the determined mutual position between the stator 103 and the rotor 105, the fault can be determined. However, to do so, there is a need for an efficient and compact representation of the magnetostatic.

Some embodiments are based on the realization that the magnetostatic can be represented as a weighted summation over real-space basis functions.

$$F_{ind}(Z|\{z_i\}, \{\lambda_i\}) = \sum_{i=0}^{N-1} \lambda_i B_r(Z|z_{i+1}, z_i) \text{ with} \quad (1)$$

$$F(Z|z_2, z_1) = 2\lambda \frac{|z_2 - z_1|}{z_2 - z_1} \log\left[\frac{z_1 - Z}{z_2 - Z}\right]$$

$$\equiv \lambda B_r(Z|z_{i+1}, z_i)$$

Here, each real-space basis function $[B_r(Z|\{z_i\}, \{\lambda_i\})]$ is analytical and is parametrized by the sequence of points $[\{z_i\}]$ forming interfaces of different materials inside the synchronous motor 101. Specifically, each real—space basis function is parameterized by pairs of adjoint points, for example, points $z_1$ and $z_2$ of the sequence of points and weighted with a surface charge density, denoted by $\lambda$, between corresponding adjoint points, for example, a surface charge density between the points $z_1$ and $z_2$. The surface charge density is determined by iteratively matching boundary conditions on the interfaces imposed by Maxwell equations. The determination of the surface charge density is explained in FIG. 9. From (1) it can be noted that the magnetic field at any point on a two-dimensional plane can be determined by the weighted summation over the real-space basis functions with the sequences of points and corresponding surface charge densities as input parameters for the real-space basis functions. Representation of the magnetostatic as the weighted summation over real-space basis functions provides a compact representation of the magnetostatic. In addition, such a representation is independent of a load of the motor.

To that end, the processor 119 determines different magnetostatics for different mutual positions at different instances of time by calculating, for each mutual position, a weighted summation over real-space basis functions parameterized on the sequences of points representing the interfaces between different materials and weighted with the surface charge densities corresponding to various pairs of adjoint points of the sequences of points. The processor 119 further selects a magnetostatic that explains the electrical output 405 given the electric input 401. Further, the processor 119 determines the sequences of points defining the mutual position between the stator 103 and the rotor 105 from the selected magnetostatic. Further, the processor 119 determines the fault of the operation of the synchronous motor 101 based on the mutual position between the stator 103 and the rotor 105.

An overall method of determining the sequences of points defining the mutual position between the stator 103 and the rotor 105 is explained below with reference to FIG. 5.

Figure 5:
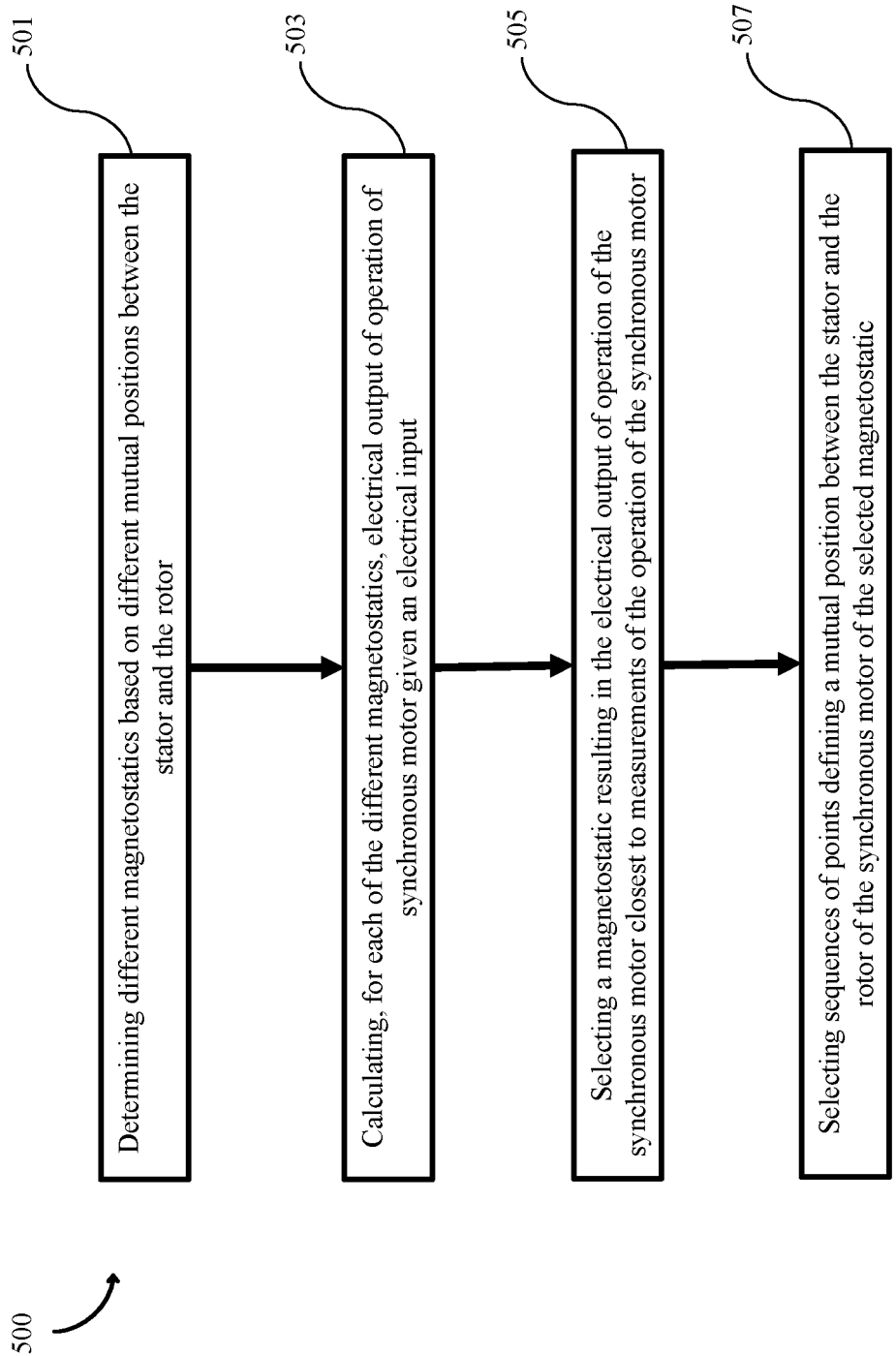
FIG. 5 shows a block diagram of a method for determining sequences of points defining a mutual position between a stator and a rotor of the synchronous motor, according to an embodiment of the present disclosure.

FIG. 5 shows a block diagram of a method 500 for determining the sequences of points defining the mutual position between the stator 103 and the rotor 105 of the synchronous motor 101, according to an embodiment of the present disclosure. At block 501, the method 500 includes determining different magnetostatics based on different mutual positions between the stator 103 and the rotor 105. According to an embodiment, the processor 119 calculates the different magnetostatics by calculating, for each mutual position, the weighted summation over the real-space basis functions parameterized on the sequences of points representing the interfaces between the different materials inside the synchronous motor 101 and weighted with the surface charge densities corresponding to various pairs of adjoint points of the sequences of points.

At block 503, the method 500 includes calculating, by the processor 119, for each of the different magnetostatics, an electrical output of the operation of the synchronous motor given the electrical input.

At block 505, the method 500 includes selecting, by the processor 119, a magnetostatic resulting in the electrical output of the operation of the synchronous motor 101 closest to the measurements of the operation of the synchronous motor 101.

At block 507, the method 500 includes selecting, by the processor 119, the sequences of points defining the mutual position between the stator 103 and the rotor 105 of the synchronous motor 101 based on the selected magneto static.

Additionally or alternatively, in some embodiments, different parameters of the real-space basis functions, i.e., the sequences of points and the corresponding surface charge densities can be predetermined offline and stored in the memory 117. During online operation, the processor 119 retrieves the different parameters of the real-space basis functions from the memory 117 and determines different magnetostatics based on the retrieved parameters.

Figure 6:
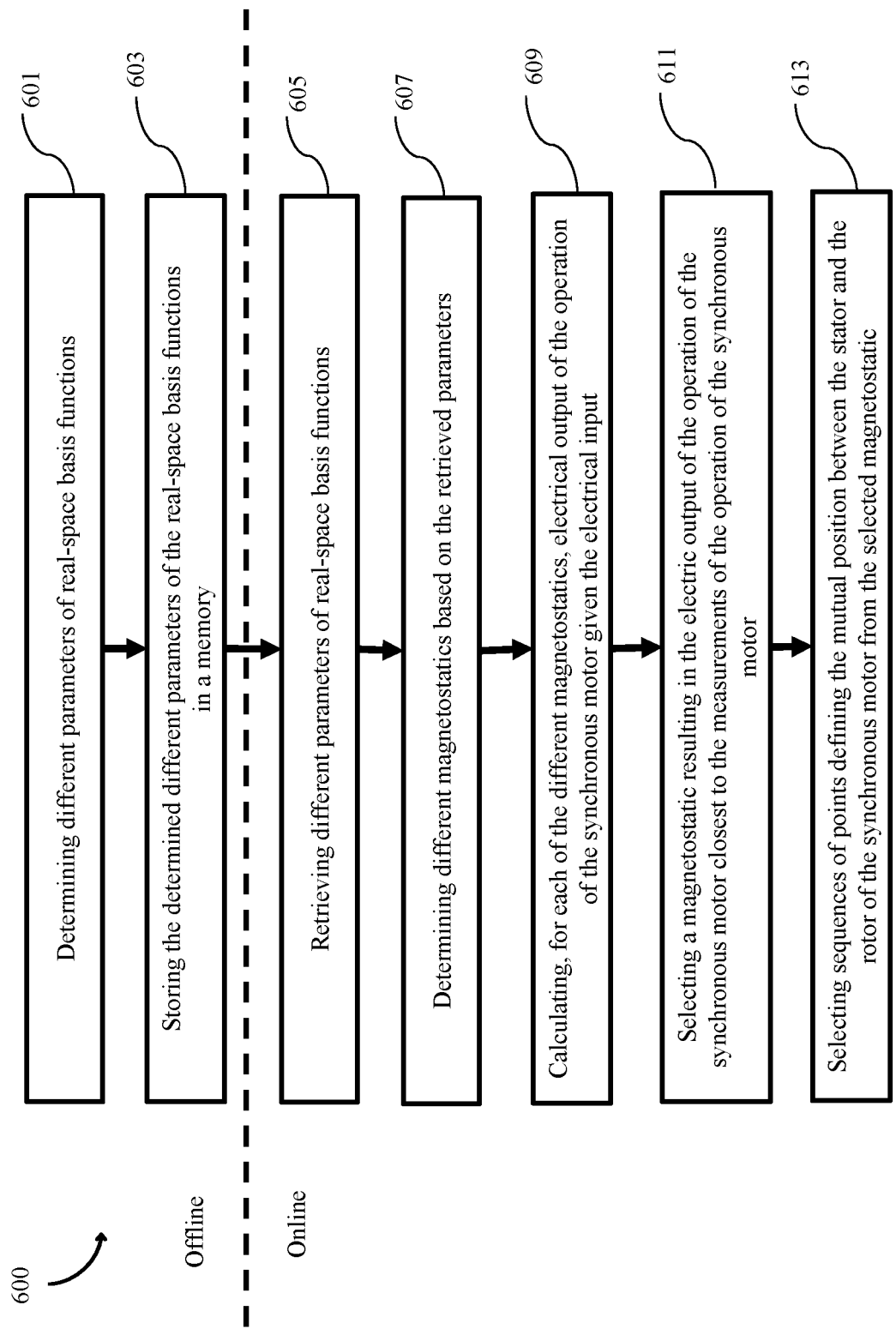
FIG. 6 shows a block diagram of a method for determining the sequences of points defining the mutual position between the stator and the rotor of the synchronous motor, according to another embodiment of the present disclosure.

FIG. 6 shows a block diagram of a method 600 for determining the sequences of points, where the different parameters of the real-space basis functions are predetermined offline, according to an embodiment of the present disclosure.

At block 601, the method 600 includes determining the different parameters of the real-space basis functions, i.e., the sequences of points and the corresponding surface charge densities, offline. At block 603, the method 600 includes storing the determined different parameters of the real-space basis functions in the memory 117.

At block 605, the method 600 includes retrieving, by the processor 119, the different parameters of the real-space basis functions from the memory 117, during online operation. Further, at block 607, the method 600 includes determining, by the processor 119, different magnetostatics based on the retrieved parameters.

At block 609, the method 600 includes calculating, by the processor 119, for each of the different magnetostatics, an electric output of the operation of the synchronous motor 101 given the electrical input. At block 611, the method 600 includes selecting, by the processor 119, a magnetostatic resulting in the electric output of the operation of the synchronous motor 101 closest to the measurements of the operation of the synchronous motor 101. At block 613, the method 600 includes selecting, by the processor 119, the sequences of points defining the mutual position between the stator 103 and the rotor 105 from the selected magnetostatic.

Further, in some embodiments, the processor 119 determines the fault based on the selected sequences of points. Specifically, a type and severity of the fault are determined based on parameters of real-space basis functions of the selected magnetostatic. For example, different types and severities of the fault in association with the different parameters of the real-space basis functions are stored in the memory 117. Additionally, in some embodiments, a control command corresponding to each type and severity of the fault is stored in the memory 117.

FIG. 7 shows a tabular column 700 of example data stored in the memory 117, according to an embodiment of the present disclosure. Different parameters 701 such as Parameters1 to parametersN and corresponding types 703 of the fault, severities 705 of the fault, and control commands 707 are stored in the memory 117. If the parameters of the real-space basis functions of the selected magnetostatic corresponds to parameters1 709, then the processor 119 selects, from the memory 117, the type of the fault as bearing fault 711 and the severity of the fault as high 713. Further, the processor 119 selects 'stop' 715 control command. The processor executes the 'stop' 715 control command to stop the synchronous motor 101 in order to protect the synchronous motor 101 against the fault. In another example, if the parameters of the real basis functions of the selected magnetostatic corresponds to parameters2 717, then the processor 119 selects, from the memory 117, the type of fault as static eccentricity fault 719 and severity of the fault as medium 721. Further, the processor 119 selects a control command of reducing speed 723 of the synchronous motor 101. The processor executes the control command of reducing speed 723 of the synchronous motor 101 to reduce the speed of the synchronous motor 101. Further, in some implementations, the control command also includes changing load and/or input of the synchronous motor 101.

In some embodiments, the type and severity of the fault may be referred to as an indication of the fault. The processor 119 transmits one or combination of the indication of the fault and the selected control command Additionally or alternatively, in some embodiments, a classifier may be used for classifying the type and severity of the fault based on the mutual position between the stator 103 and the rotor 105.

Figure 8:
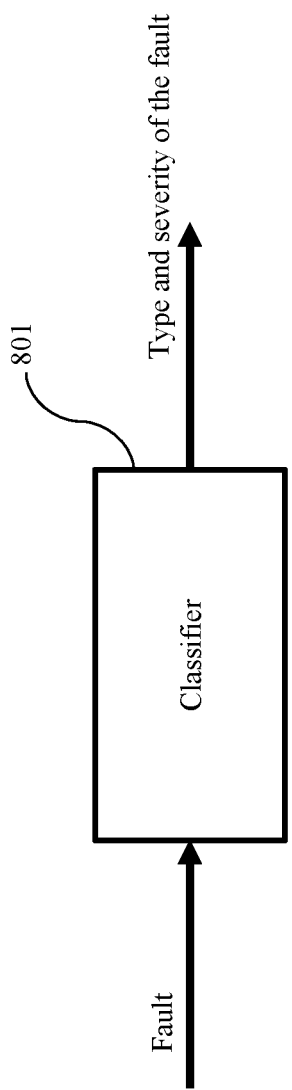
FIG. 8 shows a schematic of a classifier for classifying a type and severity of the fault, according to an embodiment of the present disclosure.

FIG. 8 shows a schematic of a classifier 801 for classifying the type and severity of the fault, according to an embodiment of the present disclosure. In an embodiment, the classifier 801 may be a neural network-based classifier. For example, the classifier 801 corresponds to an artificial neural network, such as a convolutional neural network, a recurrent neural network, a feed-forward neural network, or the like, trained to classify the type and severity of the fault based on the mutual position between the stator 103 and the rotor 105. The classifier 801 is executed by the processor 119 for classifying the type and severity of the fault based on the mutual position between the stator 103 and the rotor 105.

Some embodiments are based on that recognition that solving the magnetostatic requires the surface charge density $\lambda$. According to an embodiment, H-solver can be formulated to determine the surface charge density) and solve the magnetostatic. The formulation of H-solver is mathematically described below.

According to an embodiment, for magnetic systems without net current, magnetic field strength H-field and magnetic flux density B-field respectively satisfy $$\begin{cases} \nabla \times H = 0 \\ \nabla \cdot H = 4\pi \nabla \cdot M. \end{cases} \quad (2a)$$

$$\begin{cases} \nabla \times B = 4\pi \nabla \times M, \\ \nabla \cdot B = 0 \end{cases} \quad (2b)$$

H-field has a vanishing curl that fits E-convention. According to Eq. (2a)–∇·M is magnetic charge that generates H field; according to Eq. (2a) ∇×M is magnetic current that generates B field. A magnetic linear material is defined by a linear relation M=χH. ∇·M=χ∇·H and ∇·B=∇·H+4πM=0 demand
∇·M=∇·H=0 except material boundaries. Similarly ∇×M=χ∇×H and
∇×H=∇×B−4πM=0 demand ∇×M=∇×B=0 except the material boundaries. In short, source terms for linear materials can only exist at the material boundaries. Denoting $\hat{n}$, $\hat{t}(\hat{z}=\hat{n}\times\hat{t})$ as normal and tangent vector of the material boundary, magnetization leads to surface charge density k and surface current density K=K $\hat{n}$ as $$\lambda = M \cdot \hat{n}, K = K\hat{n} = M \times \hat{n}. \tag{3}$$

λ and K may be determined by the following boundary conditions. For two materials of different relative permeabilities $\mu_1$ and $\mu_2$, across the boundary $$a.\ \mu_1 H_{1,n} = \mu_2 H_{2,n},\ H_{1,t} = H_{2,t}. \tag{4a}$$

$$b.\ B_{1,n} = B_{2,n},\ \frac{B_{1,t}}{\mu_1} = \frac{B_{2,t}}{\mu_2} \tag{4b}$$

Here $H = H_n \hat{n} + H_t \hat{t}$ and $B = B_n \hat{n} + B_t \hat{t}$. Once λ or K is known, the field everywhere in space is known. As a boundary in 2D is a 1D curve, a 2D problem is practically reduced to a 1D problem without loss of generality.

Under a given applied field, a total H-field is a sum of an applied field $\tilde{H}_{applied}$ and an induced field $\tilde{H}_{ind}$, and can be written as $$\tilde{H} = \tilde{H}_{applied} + \tilde{H}_{ind} = \tilde{H}_{applied} + \sum_{i=0}^{N-1} \lambda_i B_r(Z|z_{i+1}, z_i) = H_x - iH_y \tag{5}$$

where the E-convention is used. From Eq. (4a), a relation between the surface charge λ(s) and H is $$4\pi\lambda(s)ds = (H_{1,n} - H_{2,n})ds = H_{1,n}\left[1 - \frac{\mu_1}{\mu_2}\right]ds = H_{2,n}\left[\frac{\mu_2}{\mu_1} - 1\right]ds \tag{6}$$

Based on the relation between the surface charge density λ(s) and H as given by (6), the H-solver is introduced.

Figure 9:
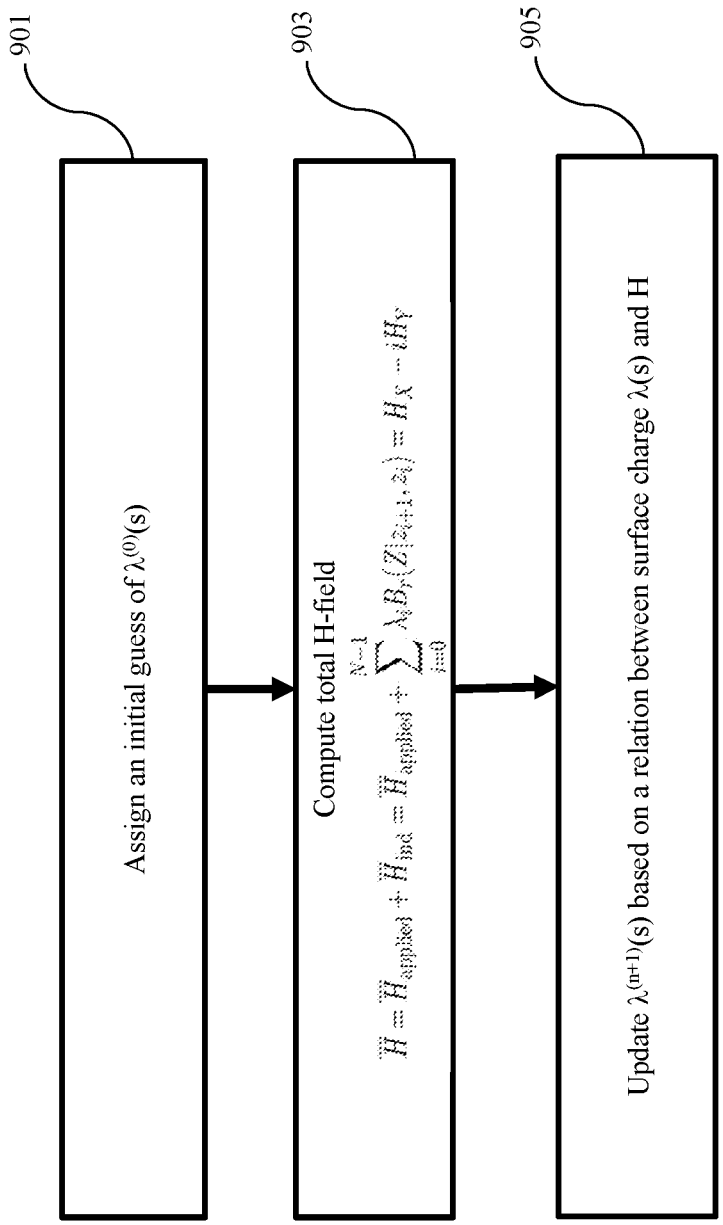
FIG. 9 shows a block diagram illustrating H-solver, according to an embodiment of the present disclosure.

FIG. 9 shows a block diagram illustrating a method for implementing the H-solver, according to an embodiment of the present disclosure. For example, the processor 119 is configured to implement the H-solver to determine the surface charge density λ(s). At block 901, the processor 119 assigns an initial guess of $\lambda^{(0)}(s)$. At block 903, the processor 119 computes the total H-field in terms of $\tilde{H}$ using Eq. (5). Further, at block 905, the processor 119 updates $\lambda^{(n+1)}(s)$ based on the relation between the surface charge density λ(s) and H, i.e., by using Eq. (6) as $$\lambda^{n+1}(s) = \frac{H_{1,n}}{4\pi}\left[1 - \frac{\mu_1}{\mu_2}\right]ds = \frac{H_{2,n}}{4\pi}\left[\frac{\mu_2}{\mu_1} - 1\right]ds \tag{7}$$

For numerical stability, $\tilde{H}$ is used in a small μ region. For example $H_{1,t}$ is evaluated when $\mu_2 > \mu_1$. The surface charge density λ(s) is iteratively updated until a termination condition is met, for example, a difference between $\lambda^{(n+1)}(s)$ and $\lambda^{(n)}(s)$ is smaller than an defined error.

Similarly, in some embodiments, a total B-field in B-convention can be expressed as $$\tilde{B} = \tilde{B}_{applied} + \tilde{B}_{ind} = \tilde{B}_{applied} + \sum_{i=0}^{N-1} K_i B_r(Z|z_{i+1}, z_i) = B_x - iB_y \tag{8}$$

From Eq. (4b), a relation between the surface current density K(s) and B is $$4\pi K(s)ds = (B_{1,t} - B_{2,t})ds = B_{1,t}\left[\frac{\mu_2}{\mu_1} - 1\right]ds = H_{2,t}\left[1 - \frac{\mu_1}{\mu_2}\right]ds \tag{9}$$

Based on the relation between the surface current density K(s) and B as given by (9), B-solver is introduced.

Figure 10:
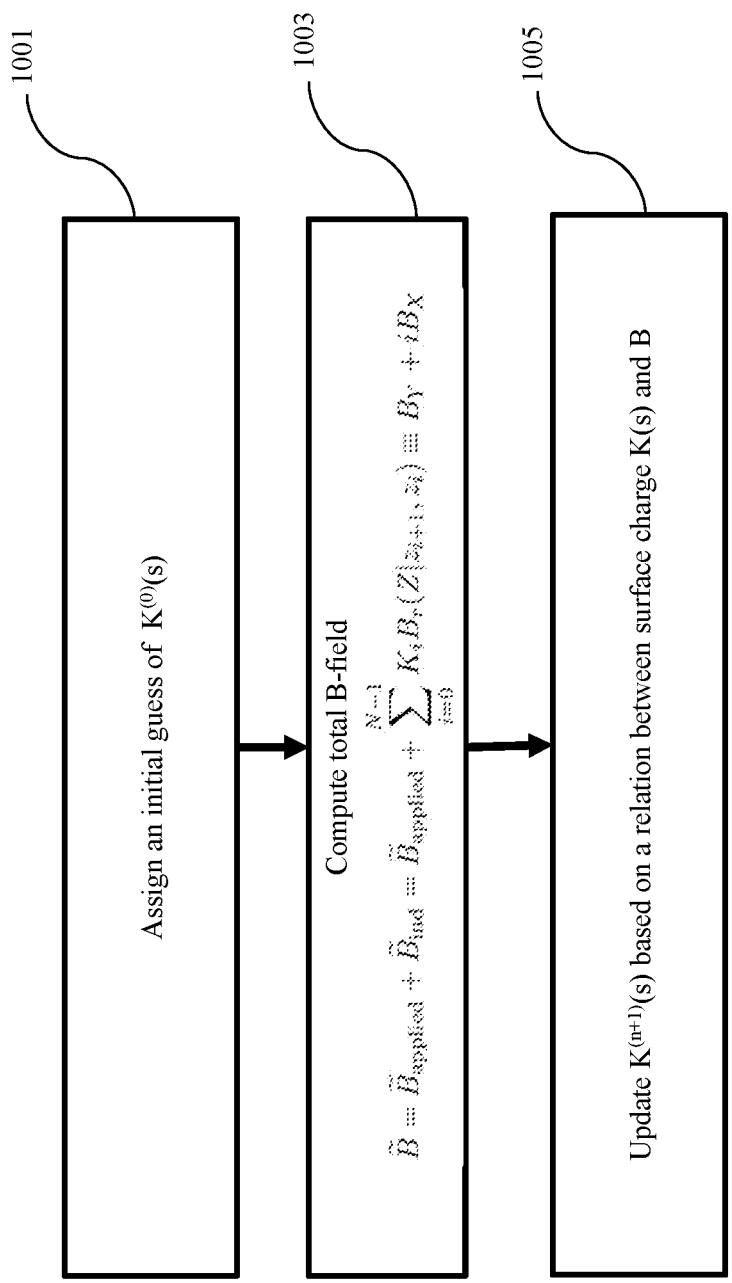
FIG. 10 shows a block diagram illustrating B-solver, according to an embodiment of the present disclosure.

FIG. 10 shows a block diagram illustrating the B-solver, according to an embodiment of the present disclosure. The processor 119 is configured to implement the B-solver to determine the surface current density K(s). At block 1001, the processor 119 assigns an initial guess of $K^{(0)}(s)$. At block 1003, the processor 119 computes the total B-field in terms of $\tilde{B}$ using Eq. (8). Further, at block 1005, the processor 119 updates $K^{(n+1)}(s)$ based on the relation between the surface charge density K(s) and B, i.e., by using Eq. (9) as $$K^{n+1}(s) = \frac{B_{1,t}^{(n)}}{4\pi}\left[\frac{\mu_2}{\mu_1} - 1\right]ds = \frac{B_{2,t}^{(n)}}{4\pi}\left[1 - \frac{\mu_1}{\mu_2}\right]ds \tag{10}$$

For numerical stability, $\tilde{B}$ is used in a large μ region. For example $B_{1,t}$ is evaluated when $\mu_2 < \mu_1$. The surface current density K(s) is iteratively updated until a termination condition is met, for example, a difference between $K^{(n+1)}(s)$ and $K^{(n)}(s)$ is smaller than an defined error.

Figure 11:
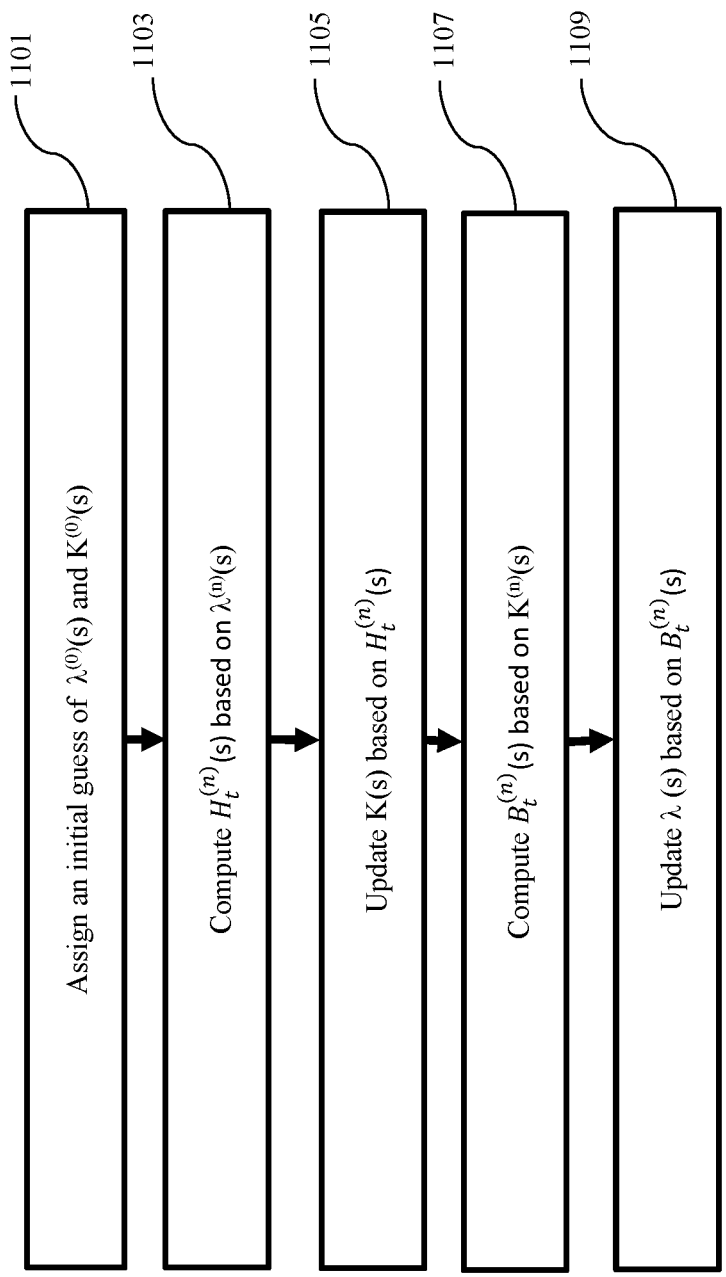
FIG. 11 shows a block diagram illustrating BH-solver, according to an embodiment of the present disclosure.

Some embodiments are based on the realization a BH-solver can be realized where both the B-field and H-field are used. The BH solver determines the surface current density K(s) and the surface charge density k(s). FIG. 11 shows a block diagram illustrating the BH-solver, according to an embodiment of the present disclosure. At block 1101, the processor 119 assigns an initial guess of $\lambda_{(0)}(s)$ and $K^{(0)}(s)$. At block 1103, the processor 119 computes $H_t^{(n)}(s)$ based on $\lambda^{(n)}(s)$. Further, at block 1105, the processor 119 updates K(s) based on $H_t^{(n)}(s)$ as $$K^{n+1}(s) = \frac{B_{1,t}^{(n)}(s) - B_{2,t}^{(n)}(s)}{4\pi} = \frac{H_t^{(n)}(s)}{4\pi}[\mu_1 - \mu_2] \tag{11}$$

At block 1107, the processor 119 computes $B_n^{(n)}(s)$ based on $K^{(n)}(s)$. Further, at block 1109, the processor 119 updates λ(s) based on $B_n^{(n)}(s)$ as $$\lambda^{n+1}(s) = \frac{H_{1,n}^{(n)}(s) - H_{2,n}^{(n)}(s)}{4\pi} = \frac{B_n^{(n)}(s)}{4\pi}\left[\frac{1}{\mu_1} - \frac{1}{\mu_2}\right] \tag{12}$$

Once the total B-field [Eq. (8)] and the surface current density K are obtained, the electrical output of the operation of the synchronous motor 101, such as a torque, can be calculated. In an embodiment, the torque can be calculated based on Lorentz force law. For a small line segment of the surface current density K in the rotor 105, a magnetic force per unit length exerted by an external magnetic field $B^{ex} = (B_X^{ex}, B_Y^{ex})$ (i.e., the field not generated within rotor region) is given by $$df = [Kds]\hat{z} \times B^{ex} = Kds(-B_Y^{ex}, B_X^{ex})$$

$$\tau_{tot} = \int d\tau = \tau_{tot}\hat{z} = \int r \times df = \hat{z} \int dsK(s)[xB_X^{ex} + xB_Y^{ex}] \quad (13)$$

Here the integration includes all interfaces inside the rotor region. Using complex representation z=x+iy and $\tilde{B}^{ex} = (B_Y^{ex} + iB_X^{ex})$, rotor torque per unit length is $$d\tau = KdZ \operatorname{Im}\left[z\tilde{B}^{ex}\right] \Rightarrow \tau_{tot} \to \sum_{i=0}^{N-1} K_i(z_{i+1} - z_i) \cdot \operatorname{Im}\left[z_i \tilde{B}_i^{ex}\right] \quad (14)$$

The torque (per unit length) can also be computed by B-field alone by using Maxwell-stress tensor; this method is more convenient as it does not require the surface current density K. For this method, a closed surface, denoted as $\partial\Omega$, which encloses an entire rotor region but excludes external sources, is selected. Expressing a total magnetic field on the selected closed surface as $B = B_n\hat{n} + B_t\hat{t}$, a magnetic part of the stress tensor and the torque experienced by the rotor (inside the closed surface $\partial\Omega$) are respectively $$\overleftrightarrow{T} = \frac{1}{4\pi}\begin{bmatrix} \frac{1}{2}(B_n^2 - B_t^2) & B_n B_t \\ B_n B_t & \frac{-1}{2}(B_n^2 - B_t^2) \end{bmatrix}, \quad (15)$$

$$d\vec{\tau} \equiv r \times \left(\overleftrightarrow{T} \cdot da\right)$$

The notation $d\vec{\tau}$ is to indicate that da is a surface element, not a line element. One convenient choice of $\partial\Omega$ is a cylinder (a circle in 2D) of radius R and height $l_z$. In polar coordinate where $\hat{n} = (\cos\theta, \sin\theta)$ and $\hat{t} = (-\sin\theta, \cos\theta)$, the surface element is $da = l_z R \, d\theta\hat{n}$. Substituting into Eq. (15), the rotor torque per unit length is given by $$\tau_{tot} = R^2 \int_0^{2\pi} d\theta \frac{B_n(R,\theta) \cdot B_t(R,\theta)}{4\pi} \quad (16)$$

Eq. (14) and (16) should give the same answer as Eq. (15) is derived from Lorentz force law.

Figure 12A:
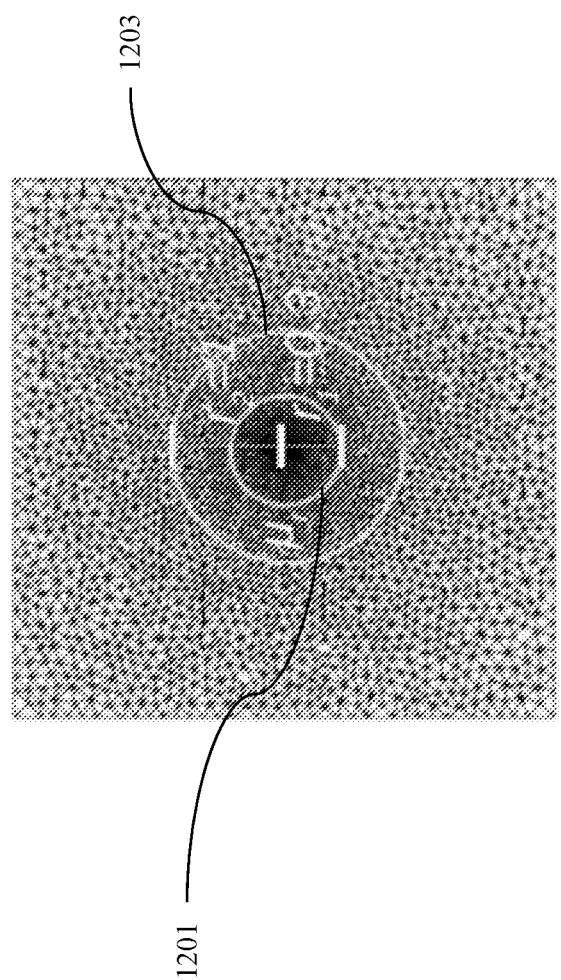
FIG. 12A illustrates a geometry of a finite-thickness cylinder, according to an embodiment of the present disclosure.

Further, to benchmark different solvers, a finite-thickness cylinder is considered. FIG. 12A illustrates a geometry of the finite-thickness cylinder, according to an embodiment of the present disclosure. The finite-thickness cylinder is of permeability $\mu_r$ and has an inner radius 1201 $r_1$=0.3 and an outer radius 1203 of $r_2$=1 under an external uniform field along $\hat{x}$. To obtain analytical solution, scalar potential $\Phi$ in polar coordinate is considered:

$$\Phi^{(1)}(r, \phi) br\cos\phi = bx, \qquad 0 < r < r1 \quad (17)$$

$$\Phi^{(2)}(r, \phi) = \left(c1r + \frac{c2}{r}\right)\cos\phi, \quad r1 < r < r2$$

$$\Phi^{(3)}(r, \phi) = \frac{d}{r}\cos\phi - r\cos\phi, \quad r > r2$$

and $-\nabla\Phi = H$. There are four variables (b, $c_1$, $c_2$, d) and four constraints are needed: two come from continuity of $\Phi$ (equivalent to the continuous $H_t$) and the other two are from $H_n^{(3)}(r_2) = \mu_r H_n^{(2)}(r_2)$ and $\mu_r H_n^{(2)}(r_1) = H_n^{(1)}(r_1)$. The applied field is $H_0 = \hat{x}$ which defines the boundary condition at $r \to \infty$: $\phi \to -x = -r\cos\phi$ at $r \gg r2$ (so that $-\nabla\Phi = +\hat{x}$). The equation in matrix form is $$\begin{bmatrix} r_1 & r_1 & 1/r_1 & 0 \\ 0 & r_2 & 1/r_2 & -1/r_2 \\ -1 & \mu_r & -\mu_r/r_1^2 & 0 \\ 0 & -\mu_r & +\mu_r/r_2^2 & -1/r_1^2 \end{bmatrix} \begin{bmatrix} b \\ c_1 \\ c_2 \\ d \end{bmatrix} = \begin{bmatrix} 0 \\ -r_2 \\ 0 \\ 1 \end{bmatrix} \quad (18)$$

A field inside the inner circle is a constant $H = -b\hat{x}$. Further, to describe two material boundaries 50, 80, 400, 1000 points per circle are considered. $\mu_r$ is varying between 2 and 100. A x-component of the field at origin, $H_x(0)$, is compared using different solvers and the results are summarized in a tabular column 1205 shown in FIG. 12B. It may be observed from the tabular column 1205 that with the same number of points, results of smaller $\mu_r$ are more accurate as expected. Upon increasing the points, results of the H/B-solver 1207 and the BH-solver 1209 approach the analytical value. The BH-solver 1209 appears to be the best one, for example, BH-solver with 50×2 points 1213 gives more accurate results compared to those obtained using finite element analysis (FEA) 1211 with 5512 points.

Additionally, to test the torque calculation, a simple reluctance motor is considered. To compute the torque of a rotor, an external field and a rotor geometry are needed. Following external field and rotor geometry are considered:

$$\begin{cases} B^{ex}(\theta_{ele}) = B_0[\cos(\theta_{ele})\hat{x} + \sin(\theta_{ele})\hat{y}] & \text{External field} \\ X^2 + Y^2 = r_{rotor}^2 & \text{Rotor outer interface} \\ \frac{X^2}{a^2} + \frac{Y^2}{b^2} & \text{Rotor inner interface} \end{cases} \quad (19)$$

Figure 13A:
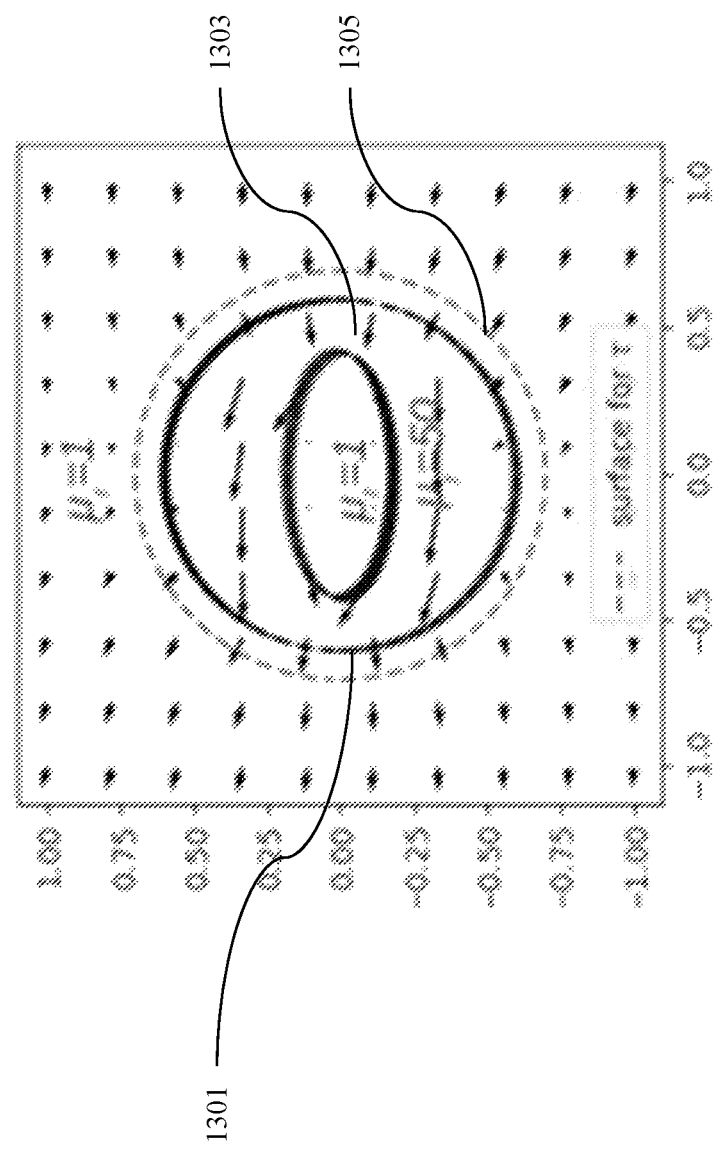
FIG. 13A shows a schematic illustrating a rotor geometry, according to an embodiment of the present disclosure.

FIG. 13A shows a schematic illustrating the rotor geometry, according to an embodiment of the present disclosure. The rotor is specified by an outer circle 1301 with a radius of $r_{rotor}$=0.6 cm and an inner ellipse 1303 of a long axis of 0.7 $r_{rotor}$ and a short axis of 0.3 $r_{rotor}$. These values are chosen randomly. A dashed circle 1305 is a surface for the torque calculation using Eq. (16).

Figure 13B:
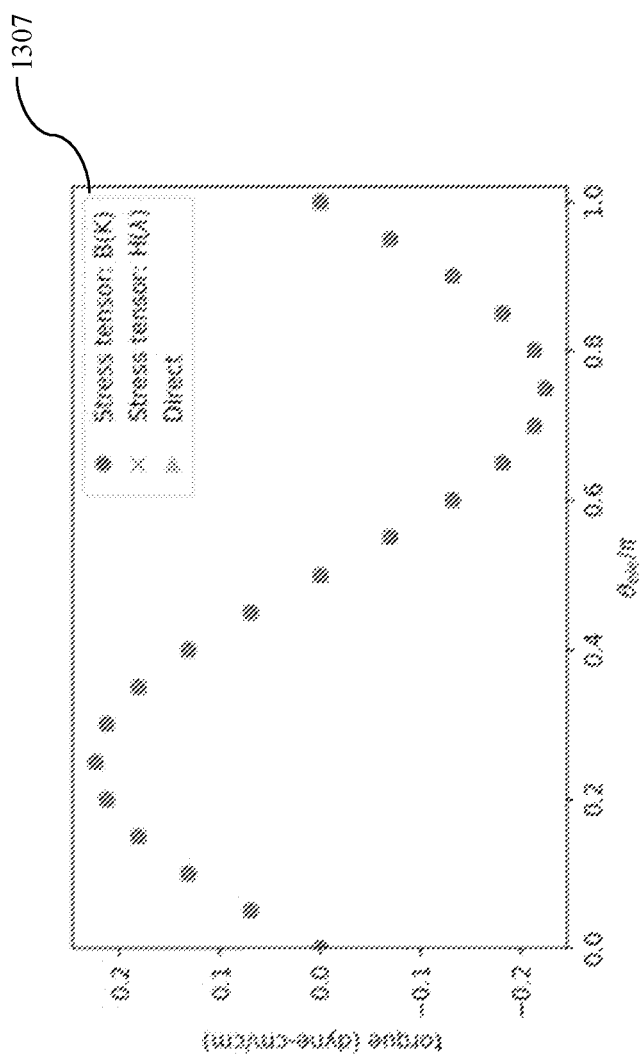
FIG. 13B shows a plot of torque as a function of electric angle, according to an embodiment of the present disclosure.

FIG. 13B shows a plot 1307 of the torque as a function of electric angle $\theta_{ele}$, according to an embodiment of the present disclosure. Results using direct Lorentz force law [Eq. (14)] and stress tensor [Eq. (16)] agree well. Eq. (16) requires B-field at the dashed circle 1305, and the B-field obtained from the surface current density and from the surface charge density are practically identical.

Figure 14:
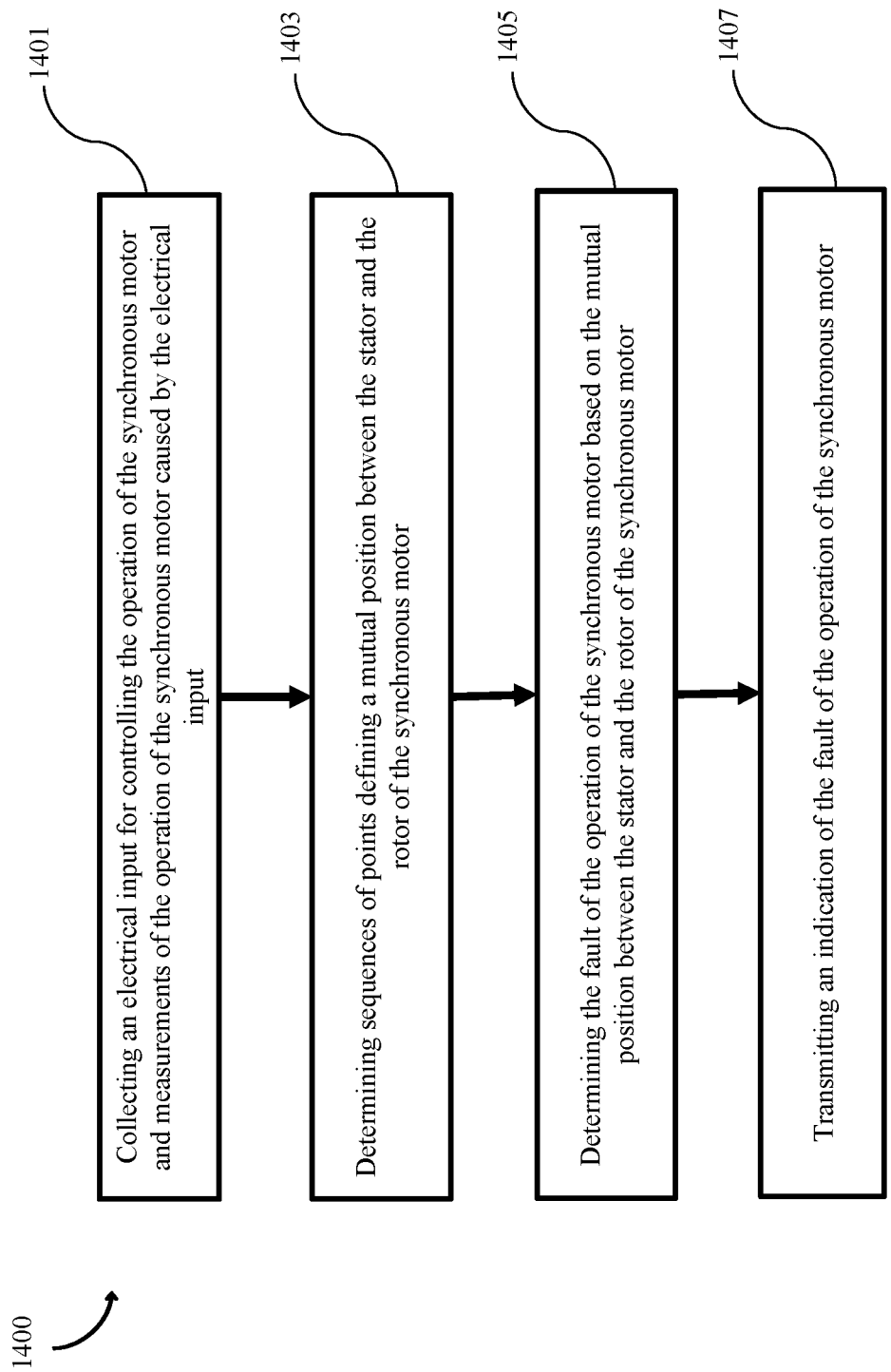
FIG. 14 shows a block diagram of a method for detecting a fault of an operation of a synchronous motor, according to an embodiment of the present disclosure.

FIG. 14 shows a block diagram of a method 1400 for detecting a fault of an operation of a synchronous motor, according to an embodiment of the present disclosure. At block 1401, the method 1400 includes collecting an electrical input for controlling the operation of the synchronous motor and measurements of the operation of the synchronous motor caused by the electrical input.

At block 1403, the method 1400 includes determining sequences of points defining a mutual position between a stator and a rotor of the synchronous motor that results in magnetostatic determined as a weighted summation over real-space basis functions parameterized on pairs of adjoint points in the determined sequence of points and weighted with a surface charge density between corresponding adjoint points, such that the resulted magnetostatic explains the measurements of the operation of the synchronous motor given the electrical input.

At block 1405, the method 1400 includes determining the fault of the operation of the synchronous motor based on the mutual position between the stator and the rotor of the synchronous motor. Further, at block 1407, the method 1400 includes transmitting an indication of the fault of the operation of the synchronous motor.

Figure 15:
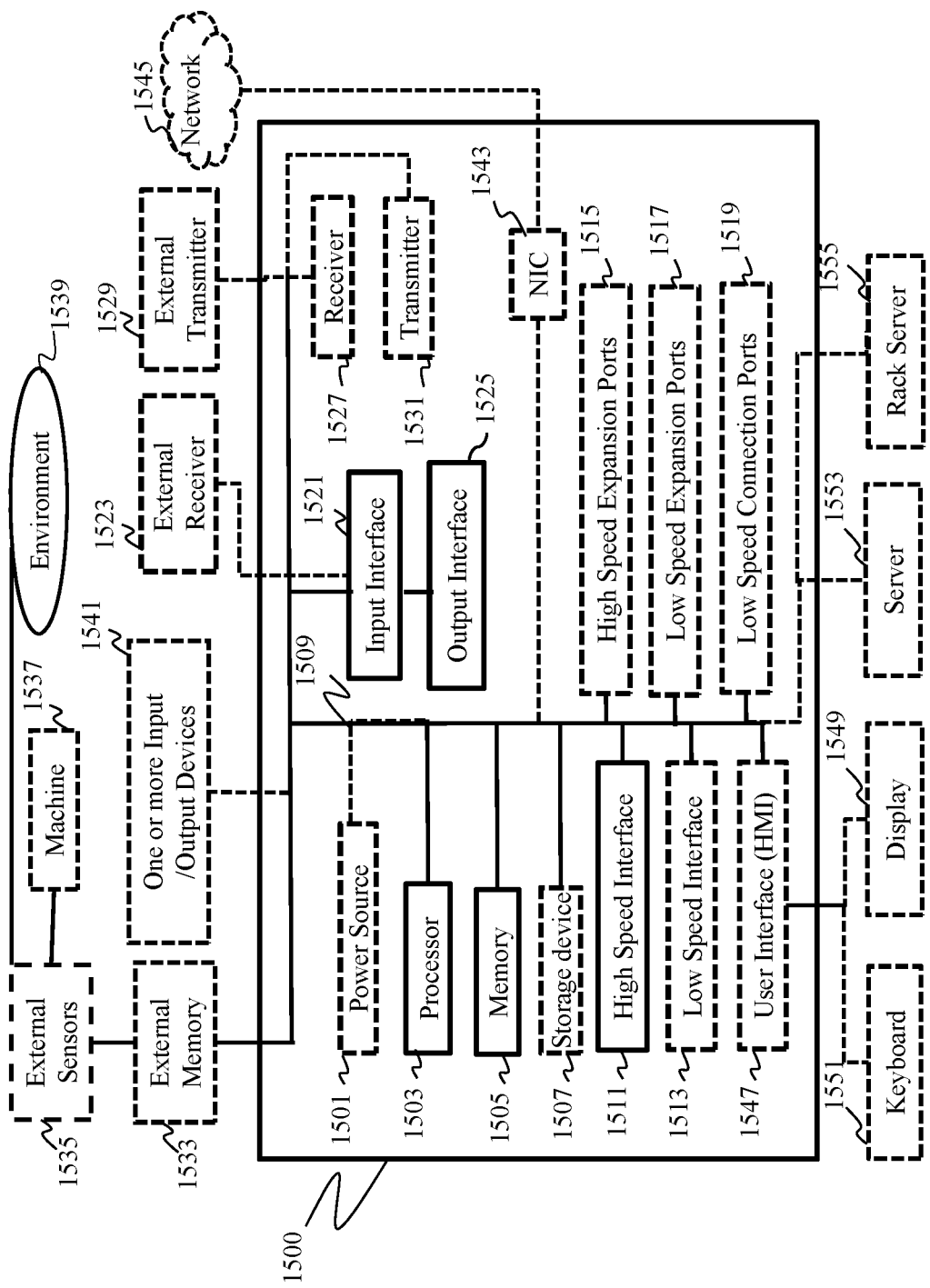
FIG. 15 is a schematic diagram illustrating a computing device that can be used for implementing systems and methods of the present disclosure.

FIG. 15 is a schematic illustrating a computing device 1500 for implementing the methods and systems of the present disclosure. The computing device 1500 includes a power source 1501, a processor 1503, a memory 1505, a storage device 1507, all connected to a bus 1509. Further, a high-speed interface 1511, a low-speed interface 1513, high-speed expansion ports 1515 and low speed connection ports 1517, can be connected to the bus 1509. In addition, a low-speed expansion port 1519 is in connection with the bus 1509. Further, an input interface 1521 can be connected via the bus 1509 to an external receiver 1523 and an output interface 1525. A receiver 1527 can be connected to an external transmitter 1529 and a transmitter 1531 via the bus 1509. Also connected to the bus 1509 can be an external memory 1533, external sensors 1535, machine(s) 1537, and an environment 1539. Further, one or more external input/output devices 1541 can be connected to the bus 1509. A network interface controller (NIC) 1543 can be adapted to connect through the bus 1509 to a network 1545, wherein data or other data, among other things, can be rendered on a third-party display device, third party imaging device, and/or third-party printing device outside of the computer device 1500.

The memory 1505 can store instructions that are executable by the computer device 1500 and any data that can be utilized by the methods and systems of the present disclosure. The memory 1505 can include random access memory (RAM), read only memory (ROM), flash memory, or any other suitable memory systems. The memory 1505 can be a volatile memory unit or units, and/or a non-volatile memory unit or units. The memory 1505 may also be another form of computer-readable medium, such as a magnetic or optical disk.

The storage device 1507 can be adapted to store supplementary data and/or software modules used by the computer device 1500. The storage device 1507 can include a hard drive, an optical drive, a thumb-drive, an array of drives, or any combinations thereof. Further, the storage device 1507 can contain a computer-readable medium, such as a floppy disk device, a hard disk device, an optical disk device, or a tape device, a flash memory or other similar solid-state memory device, or an array of devices, including devices in a storage area network or other configurations. Instructions can be stored in an information carrier. The instructions, when executed by one or more processing devices (for example, the processor 1503), perform one or more methods, such as those described above.

The computing device 1500 can be linked through the bus 1509, optionally, to a display interface or user Interface (HMI) 1547 adapted to connect the computing device 1500 to a display device 1549 and a keyboard 1551, wherein the display device 1549 can include a computer monitor, camera, television, projector, or mobile device, among others. In some implementations, the computer device 1500 may include a printer interface to connect to a printing device, wherein the printing device can include a liquid inkjet printer, solid ink printer, large-scale commercial printer, thermal printer, UV printer, or dye-sublimation printer, among others.

The high-speed interface 1511 manages bandwidth-intensive operations for the computing device 1500, while the low-speed interface 1513 manages lower bandwidth-intensive operations. Such allocation of functions is an example only. In some implementations, the high-speed interface 1511 can be coupled to the memory 1505, the user interface (HMI) 1547, and to the keyboard 1551 and the display 1549 (e.g., through a graphics processor or accelerator), and to the high-speed expansion ports 1515, which may accept various expansion cards via the bus 1509. In an implementation, the low-speed interface 1513 is coupled to the storage device 1507 and the low-speed expansion ports 1517, via the bus 1509. The low-speed expansion ports 1517, which may include various communication ports (e.g., USB, Bluetooth, Ethernet, wireless Ethernet) may be coupled to the one or more input/output devices 1541. The computing device 1500 may be connected to a server 1553 and a rack server 1555. The computing device 1500 may be implemented in several different forms. For example, the computing device 1500 may be implemented as part of the rack server 1555.

The following description provides exemplary embodiments only, and is not intended to limit the scope, applicability, or configuration of the disclosure. Rather, the following description of the exemplary embodiments will provide those skilled in the art with an enabling description for implementing one or more exemplary embodiments. Contemplated are various changes that may be made in the function and arrangement of elements without departing from the spirit and scope of the subject matter disclosed as set forth in the appended claims.

Specific details are given in the following description to provide a thorough understanding of the embodiments. However, understood by one of ordinary skill in the art can be that the embodiments may be practiced without these specific details. For example, systems, processes, and other elements in the subject matter disclosed may be shown as components in block diagram form in order not to obscure the embodiments in unnecessary detail. In other instances, well-known processes, structures, and techniques may be shown without unnecessary detail in order to avoid obscuring the embodiments. Further, like reference numbers and designations in the various drawings indicate like elements.

Also, individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process may be terminated when its operations are completed but may have additional steps not discussed or included in a figure. Furthermore, not all operations in any particularly described process may occur in all embodiments. A process may correspond to a method, a function, a procedure, a subroutine, a subprogram, etc. When a process corresponds to a function, the function's termination can correspond to a return of the function to the calling function or the main function.

Furthermore, embodiments of the subject matter disclosed may be implemented, at least in part, either manually or automatically. Manual or automatic implementations may be executed, or at least assisted, through the use of machines, hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

Various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine. Typically, the functionality of the program modules may be combined or distributed as desired in various embodiments.

Embodiments of the present disclosure may be embodied as a method, of which an example has been provided. The acts performed as part of the method may be ordered in any suitable way. Accordingly, embodiments may be constructed in which acts are performed in an order different than illustrated, which may include performing some acts concurrently, even though shown as sequential acts in illustrative embodiments.

Although the present disclosure has been described with reference to certain preferred embodiments, it is to be understood that various other adaptations and modifications can be made within the spirit and scope of the present disclosure. Therefore, it is the aspect of the appended claims to cover all such variations and modifications as come within the true spirit and scope of the present disclosure.

We claim:

1. A fault detector for detecting a fault of an operation of a synchronous motor including a stator and a rotor separated by an air gap, the fault detector comprising: a processor; and a memory having instructions stored thereon that, when executed by the processor, cause the fault detector to:
   collect, over a communication channel including one or a combination of a wired and wireless communication link, an electrical input for controlling the operation of the synchronous motor, and measurements associated with the operation of the synchronous motor caused by the electrical input;
   determine sequences of points defining a mutual position between the stator and the rotor of the synchronous motor forming interfaces of different materials inside the synchronous motor that results in magnetostatic determined as a weighted summation over real-space basis functions parameterized on pairs of adjoint points in the determined sequence of points and weighted with a surface charge density between corresponding adjoint points, such that the resulted magnetostatic explains the measurements of the operation of the synchronous motor given the electrical input;
   determine the fault of the operation of the synchronous motor based on the mutual position between the stator and the rotor of the synchronous motor; and
   transmit, over the communication channel, one or a combination of an indication of the fault of the operation of the synchronous motor and a control command selected based on the fault.

2. The fault detector of claim 1, wherein to determine the sequences of points defining the mutual position between the stator and the rotor, the processor is further configured to:
   determine different magnetostatics based on different mutual positions between the stator and the rotor by calculating, for each mutual position, a weighted summation over the real-space basis functions parameterized on sequences of points representing the interfaces between different materials inside the synchronous motor and weighted with surface charge density determined by iteratively matching boundary conditions on the interfaces imposed by Maxwell equations;
   calculate, for each of the different magnetostatics, an electrical output of the operation of the synchronous motor given the electrical input;
   select a magnetostatic resulting in the electrical output of the synchronous motor closest to the measurements of the operation of the synchronous motor; and
   select the sequences of points defining the mutual position between the stator and the rotor of the synchronous motor from the selected magnetostatic.

3. The fault detector of claim 1, wherein to determine the sequences of points defining the mutual position between the stator and the rotor of the synchronous motor, the processor is further configured to:
   retrieve different parameters of the real-space basis functions stored in the memory, the different parameters include different sequences of points and corresponding surface charge densities determined for different mutual positions between the stator and the rotor of the synchronous motor;
   determine different magnetostatics based on the retrieved parameters;
   calculate, for each of the different magnetostatics, an electrical output of the operation of the synchronous motor given the electrical input;
   select a magnetostatic resulting in the electric output of the operation of the synchronous motor closest to the measurements of the operation of the synchronous motor; and
   select the sequences of points defining the mutual position between the stator and the rotor of the synchronous motor from the selected magnetostatic.

4. The fault detector of claim 3, wherein the electrical output of the operation of the synchronous motor includes a torque, and wherein the processor is further configured to calculate the torque based on Lorentz force law and an external magnetic field.

5. The fault detector of claim 3, wherein different types and severities of fault in association with the different parameters of the real-space basis functions are stored in the memory, wherein the processor is further configured to select a type and severity of the fault, a control command, or both from the memory based on parameters of real-space basis functions of the selected magnetostatic.

6. The fault detector of claim 5, wherein the processor is further configured to control the synchronous motor based on the control command.

7. The fault detector of claim 1, wherein the indication of the fault includes a type and severity of the fault, and wherein the processor is further configured to execute a classifier trained for classifying the type and the severity of the fault based on the mutual position between the stator and the rotor.

8. The fault detector of claim 1, wherein, to solve the magnetostatic, the processor is further configured to compute a magnetic field strength based on an initial value of the surface charge density and update the surface charge density, based on a relation between the surface charge density and the magnetic field strength, iteratively until a termination condition is met.

9. The fault detector of claim 1, wherein, to solve the magnetostatic, the processor is further configured to compute a magnetic flux density based on an initial value of a surface current density and update the surface current density, based on a relation between the surface current density and the magnetic flux density, iteratively until a termination condition is met.

10. The fault detector of claim 1, wherein the processor is further configured to:
  assign an initial value to the surface charge density and surface current density;
  compute a magnetic field strength based on the initial value of surface charge density;
  update the surface current density, based on the magnetic field strength;
  compute a magnetic flux density based on the updated surface charge density; and
  update the surface charge density based on the magnetic flux density.

11. The fault detector of claim 1, wherein the electrical input includes one or a combination of a current and a voltage of each winding of the synchronous motor, and wherein the measurements include one or a combination of output torques and mutual inductance between different windings.

12. The fault detector of claim 1, wherein the determined the fault of the operation of the synchronous motor includes one or a combination of a bearing fault and an eccentricity fault.

13. A method for detecting a fault of an operation of a synchronous motor including a stator and a rotor separated by an air gap, the method comprising:
  collecting, over a communication channel including one or a combination of a wired and wireless communication link, an electrical input for controlling the operation of the synchronous motor and measurements of the operation of the synchronous motor caused by the electrical input;
  determining sequences of points defining a mutual position between the stator and the rotor of the synchronous motor forming interfaces of different materials inside the synchronous motor that results in magnetostatic determined as a weighted summation over real-space basis functions parameterized on pairs of adjoint points in the determined sequence of points and weighted with a surface charge density between corresponding adjoint points, such that the resulted magnetostatic explains the measurements of the operation of the synchronous motor given the electrical input;
  determining the fault of the operation of the synchronous motor based on the mutual position between the stator and the rotor of the synchronous motor; and
  transmitting over the communication channel one or a combination of an indication of the fault of the operation of the synchronous motor and a control command selected based on the fault.

14. The method of claim 13, wherein to determine the sequences of points defining the mutual position between the stator and the rotor, the method further comprises:
  determining different magnetostatics based on different mutual positions between the stator and the rotor by calculating, for each mutual position, a weighted summation over the real-space basis functions parameterized on sequences of points representing the interfaces between different materials inside the synchronous motor and weighted with surface charge density determined by iteratively matching boundary conditions on the interfaces imposed by Maxwell equations;
  calculating, for each of the different magnetostatics, an electrical output of the operation of the synchronous motor given the electrical input;
  selecting a magnetostatic resulting in the electrical output of the synchronous motor closest to the measurements of the operation of the synchronous motor; and
  selecting the sequences of points defining the mutual position between the stator and the rotor of the synchronous motor from the selected magnetostatic.

15. The method of claim 13, wherein to determine the sequences of points defining the mutual position between the stator and the rotor of the synchronous motor, the method further comprises:
  retrieving different parameters of the real-space basis functions stored in a memory, the different parameters include different sequences of points and corresponding surface charge densities determined for different mutual positions between the stator and the rotor of the synchronous motor;
  determining different magnetostatics based on the retrieved parameters;
  calculating, for each of the different magnetostatics, an electrical output of the operation of the synchronous motor given the electrical input;
  selecting a magnetostatic resulting in the electrical output of the operation of the synchronous motor closest to the measurements of the operation of the synchronous motor; and
  selecting the sequences of points defining the mutual position between the stator and the rotor of the synchronous motor from the selected magnetostatic.

16. The method of claim 15, wherein different types and severities of fault in association with the different parameters of the real-space basis functions are stored in the memory, and wherein the method further comprises selecting a type and severity of the fault, a control command, or both from the memory based on parameters of real-space basis functions of the selected magnetostatic.

17. The method of claim 16, wherein the method further comprises controlling the synchronous motor based on the control command.

18. The method of claim 13, wherein the indication of the fault includes a type and severity of the fault, and wherein the method further comprises executing a classifier trained for classifying the type and the severity of the fault based on the mutual position between the stator and the rotor.

19. The method of claim 13, wherein the electrical input includes one or a combination of a current and a voltage of each winding of the synchronous motor, and wherein the measurements include one or a combination of output torques and mutual inductance between different windings.

20. A non-transitory computer-readable storage medium embodied thereon a program executable by a processor for performing a method for detecting a fault of an operation of a synchronous motor including a stator and a rotor separated by an air, the method comprising:
  collecting, over a communication channel including one or a combination of a wired and wireless communication link, an electrical input for controlling the operation of the synchronous motor and measurements of the operation of the synchronous motor caused by the electrical input;
  determining sequences of points defining a mutual position between the stator and the rotor of the synchronous motor forming interfaces of different materials inside the synchronous motor that results in magnetostatic determined as a weighted summation over real-space basis functions parameterized on pairs of adjoint points in the determined sequence of points and weighted with a surface charge density between corresponding adjoint points, such that the resulted magnetostatic explains the measurements of the operation of the synchronous motor given the electrical input;

determining the fault of the operation of the synchronous motor based on the mutual position between the stator and the rotor of the synchronous motor; and transmitting over the communication channel one or a combination of an indication of the fault of the operation of the synchronous motor and a control command selected based on the fault.

\* \* \* \* \*